(12) United States Patent
Miyashita et al.

(10) Patent No.: US 7,924,426 B2
(45) Date of Patent: Apr. 12, 2011

(54) INFORMATION PROCESSING APPARATUS FOR INTERFERENCE SIGNAL PROCESSING

(75) Inventors: Tomoyuki Miyashita, Utsunomiya (JP); Takahiro Matsumoto, Utsunomiya (JP); Hideki Ina, Tokyo (JP)

(73) Assignee: Canon Kabushiki Kaisha, Tokyo (JP)

( * ) Notice: Subject to any disclaimer, the term of this patent is extended or adjusted under 35 U.S.C. 154(b) by 294 days.

(21) Appl. No.: 12/032,205

(22) Filed: Feb. 15, 2008

(65) Prior Publication Data

US 2008/0285052 A1 Nov. 20, 2008

(30) Foreign Application Priority Data

Feb. 21, 2007 (JP) ................................ 2007-041277
May 28, 2007 (JP) ................................ 2007-140863

(51) Int. Cl.
*G01B 11/02* (2006.01)
*G01B 9/02* (2006.01)
(52) U.S. Cl. .................... 356/450; 356/511; 356/497
(58) Field of Classification Search .............. 356/479, 356/497, 511–514, 489, 495, 450; 355/53
See application file for complete search history.

(56) References Cited

U.S. PATENT DOCUMENTS

| 5,398,113 | A | | 3/1995 | de Groot | |
|---|---|---|---|---|---|
| 5,706,085 | A | * | 1/1998 | Blossey et al. | 356/512 |
| 6,028,670 | A | * | 2/2000 | Deck | 356/497 |
| 7,289,225 | B2 | * | 10/2007 | De Groot | 356/497 |
| 2005/0078318 | A1 | | 4/2005 | De Groot | |

FOREIGN PATENT DOCUMENTS

WO  WO-02/082008 A1 * 10/2002

\* cited by examiner

*Primary Examiner* — Patrick J Connolly

(74) *Attorney, Agent, or Firm* — Canon U.S.A., Inc., IP Division

(57) ABSTRACT

A shape measuring apparatus for measuring the shape of a measurement target surface includes an interferometer and computer. The interferometer senses interference light formed by measurement light from the measurement target surface and reference light by a photoelectric converter, while changing the light path length of the measurement light or the reference light. The computer Fourier-transforms a first interference signal sensed by the photoelectric converter to obtain a phase distribution and an amplitude distribution, shapes the amplitude distribution, inversely Fourier-transforms the phase distribution and the shaped amplitude distribution to obtain a second interference signal, and determines the shape of the measurement target surface based on the second interference signal.

12 Claims, 48 Drawing Sheets

$W(f) = EXP(-(f-fs)2/\sigma) : f < fs$ $W(f) = 1 \qquad\qquad : fs \leq f \leq fe$ $W(f) = EXP(-(f-fe)2/\sigma) : f > fs$

F I G. 13
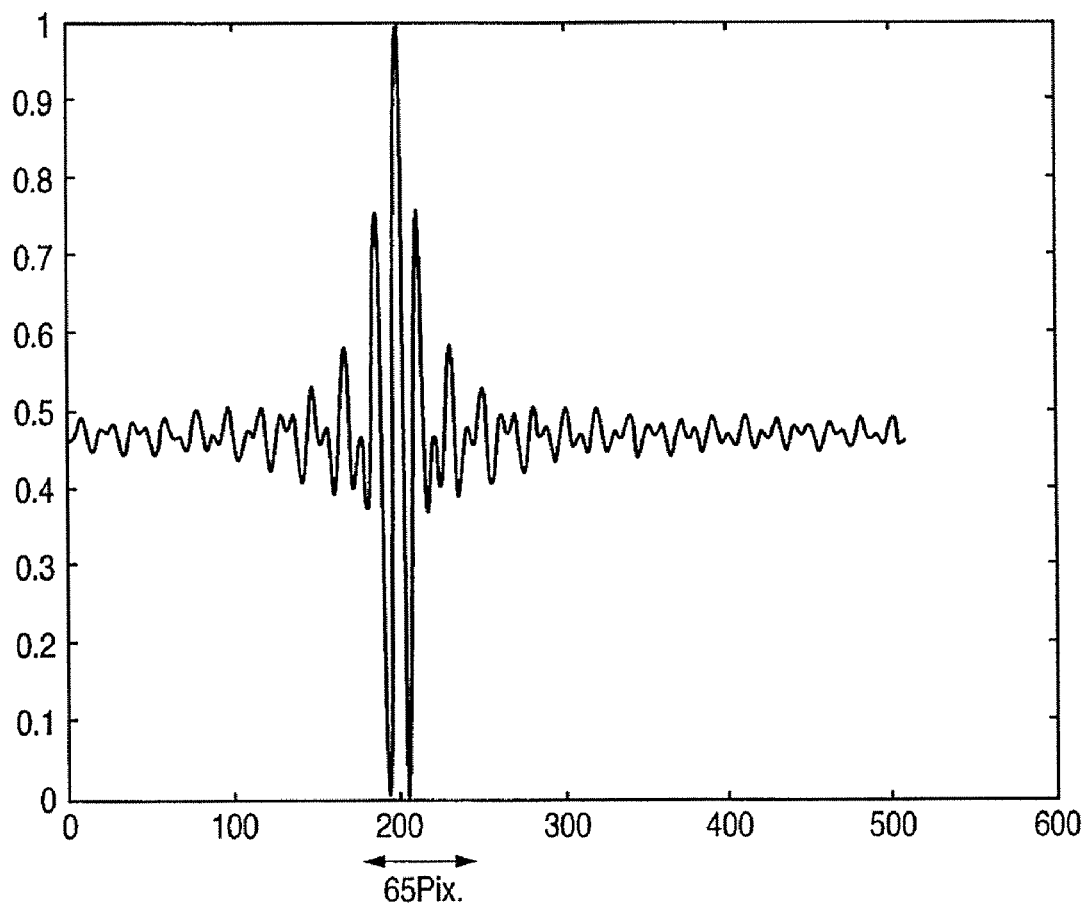

F I G. 30
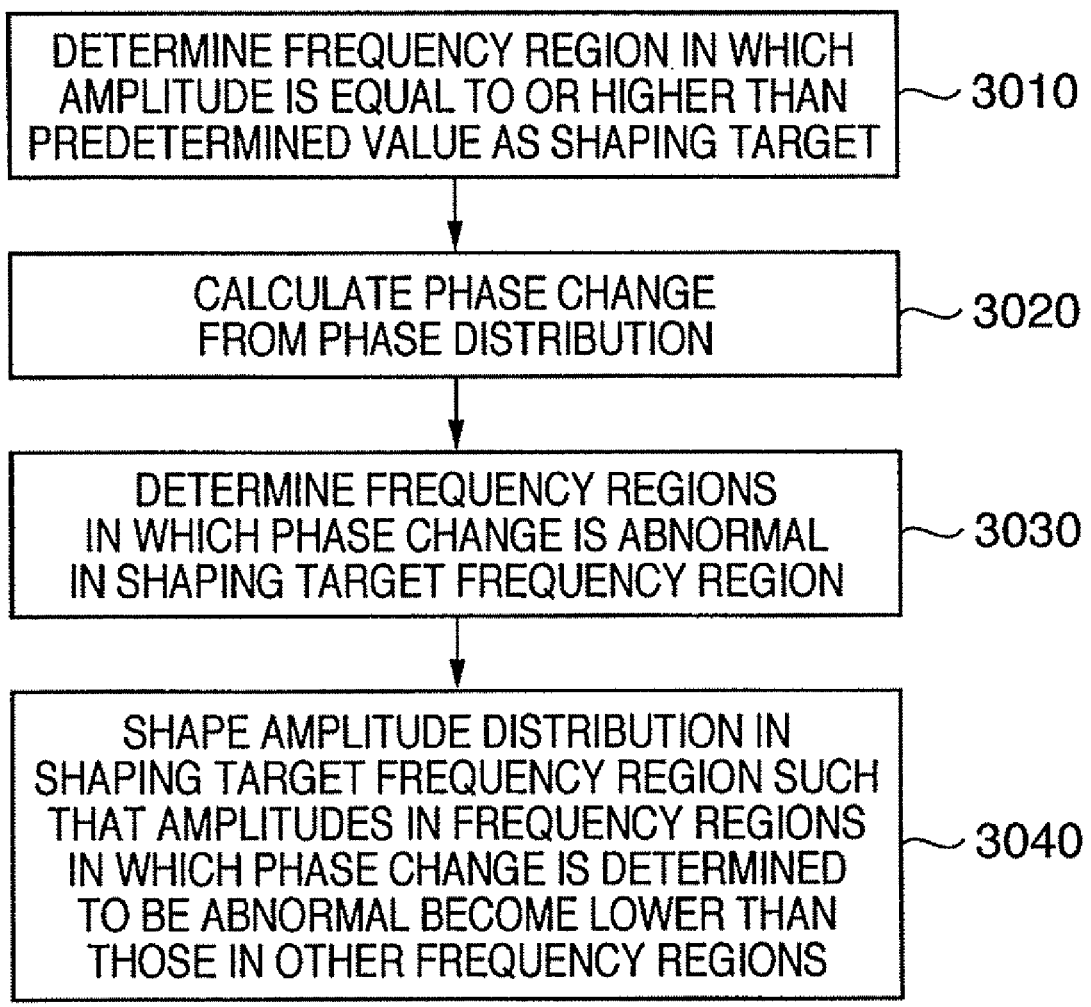

INFORMATION PROCESSING APPARATUS FOR INTERFERENCE SIGNAL PROCESSING

BACKGROUND OF THE INVENTION

1. Field of the Invention

The present invention relates to a shape measuring apparatus which measures the shape of a measurement target surface, an exposure apparatus which includes the shape measuring apparatus, and a computer which processes an interference signal provided from an interferometer to determine the shape of the measurement target surface.

2. Description of the Related Art

There have been known various methods of measuring the three-dimensional shape of a measurement target surface using light interference. Of these methods, a method using a white light interference scheme utilizes the fact that white light has low coherence, and is effective for performing precise measurement of the three-dimensional shape of the measurement target surface.

Various types of white light interference scheme exist, including Mirau, Michelson, and Linnik. One apparatus of the Mirau type of white light interference scheme is a three-dimensional surface structure analyzing microscope given the product series name "New View" and is commercially available from Zygo Corporation. The measurement principle of the three-dimensional surface structure analyzing microscope (interferometer) will be explained with reference to FIGS. 6 and 7.

As shown in FIG. 6, an objective lens 610 accommodates a half mirror 611 and internal reference mirror 612 which form reference light. In this microscope, the reference light interferes with measurement light reflected by a measurement target surface 620. As shown in FIG. 7, an interference image is formed on the image sensing plane of an image sensor 650 which is optically conjugate to the measurement target surface 620. A white light source 640 uses, for example, a halogen lamp. A driving unit 660 vertically drives the objective lens 610. The driving unit 660 controls a position sensor such as a capacitance sensor to detect the position of the objective lens 610, and controls a driving element such as a piezoelectric element to drive the objective lens 610, on the basis of the detection result. While the driving unit 660 changes the position (and consequently, the light path length) of the measurement light) of the objective lens 610, the image sensor 650 senses an interference image at each position. A computer captures the interference image sensed by the image sensor 650, and executes frequency domain analysis processing to obtain the height data of the measurement target surface with a vertical resolution of 0.1 nm. This frequency domain analysis processing uses an FFT (Fast Fourier Transformation) called FDA (Frequency Domain Analysis). The detection range of the horizontal resolution is determined by the imaging magnification from the measurement target surface 620 to the image sensor 650, and the pixel pitch of the image sensor 650. U.S. Pat. No. 5,398,113 discloses this technique.

FIG. 8 illustrates a white light interference signal from a given pixel of the image sensor 650. This white light interference signal is also called an interferogram. The abscissa indicates the measurement value obtained by the capacitance sensor after driving the objective lens by the driving element such as a piezoelectric element. The ordinate indicates the output from the given pixel of the image sensor 650. The peak position of the white light interference signal is measured, and a measurement value which corresponds to it and is obtained by the position sensor such as a capacitance sensor serves as the height measurement value of the measurement target surface at the given pixel. Measuring the heights of the measurement target surface at all the pixels of the image sensor 650 allows three-dimensional shape measurement.

The above-described FDA method calculates the peak position of the contrast using the phase gradient of a Fourier spectrum.

In the white light interference scheme, the key to measurement resolution and precision lay in the accuracy of obtaining a position at which the light path difference is zero. In addition to the FDA method, several fringe analyzing methods have been proposed for doing so, such as a phase crossing method and a method of calculating the envelope of a white light interference fringe using a phase shift method or Fourier transformation method to obtain the zero-crossing point of the light path difference from the maximum position of the fringe contrast.

The above-described white light interference scheme uses light quite different from "white light" in practice. More specifically, most of apparatuses use light sources having spectral distributions that are hardly "white light" spectral distributions. FIG. 9 shows an example of the spectral distribution of a light source commercially available as a white LED. This white LED uses a blue laser as the original light source, and therefore exhibits a partially convex spectral distribution having a high light intensity peak around a wavelength of 440 nm and a light intensity peak around a wavelength of 580 nm in the wavelength range from 500 nm to 700 nm. The white light interference scheme using such a light source increases the coherence length of the white light interference signal shown in FIG. 8. Since the coherence property of the white light interference signal deviates from the original one, it cannot attain high contrast. This can be an obstacle to the achievement of high precision.

In addition to the light source, there are various factors which inhibit ideal white light interference. For example, the spectral transmittance characteristic of an optical system, the spectrophotoelectric conversion efficiency characteristic of a photoelectric converter, and the like increase the coherence length of the white light interference signal because they are not flat in the frequency region used. This makes it difficult to obtain a high-contrast white light interference signal.

The light source, optical system, and photoelectric converter required to generate ideal white light interference result in an enormous cost.

SUMMARY OF THE INVENTION

The present invention has been made in consideration of the above-described problems, and has as its object to, for example, obtain a high-contrast interference signal by signal processing.

According to the first aspect of the present invention, there is provided an apparatus for measuring a shape of a measurement target surface, comprises:

an interferometer configured to sense interference light formed by measurement light from the measurement target surface and reference light from a reference surface by a photoelectric converter; and a computer configured to Fourier-transform a first interference signal sensed by the photoelectric converter to obtain a phase distribution and an amplitude distribution, shape the amplitude distribution, inversely Fourier-transform the phase distribution and the shaped amplitude distribution to obtain a second interference signal, and determine the shape of the measurement target surface on the basis of the second interference signal.

According to the second aspect of the present invention, there is provided a computer comprises:

a Fourier transformation unit configured to Fourier-transform a first interference signal sensed by a photoelectric converter of an interferometer which senses interference light formed by measurement light from a measurement target surface and reference light by the photoelectric converter to obtain a phase distribution and an amplitude distribution;

a shaping unit configured to shape the amplitude distribution obtained by the Fourier transformation unit;

an inverse Fourier transformation unit configured to inversely Fourier-transform the phase distribution obtained by the Fourier transformation unit and the amplitude distribution obtained by the shaping unit, to obtain a second interference signal; and a shape determination unit configured to determine a shape of the measurement target surface on the basis of the second interference signal.

According to the third aspect of the present invention, there is provided a program for making a computer function as an apparatus comprises:

a Fourier transformation unit configured to Fourier-transform a first interference signal sensed by a photoelectric converter of an interferometer which senses interference light formed by measurement light from a measurement target surface and reference light by the photoelectric converter to obtain a phase distribution and an amplitude distribution;

a shaping unit configured to shape the amplitude distribution obtained by the Fourier transformation unit;

an inverse Fourier transformation unit configured to inversely Fourier-transform the phase distribution obtained by the Fourier transformation unit and the amplitude distribution obtained by the shaping unit, to obtain a second interference signal; and a shape determination unit configured to determine a shape of the measurement target surface on the basis of the second interference signal.

According to the fourth aspect of the present invention, there is provided an apparatus for measuring a surface shape of a substrate having a surface coated with a film, comprises:

an interferometer configured to split broadband light from a light source into measurement light and reference light, and to sense interference light formed by the measurement light from the surface of the substrate and the reference light by a photoelectric converter; and a computer configured to Fourier-transform a first interference signal sensed by the photoelectric converter to obtain a phase distribution and an amplitude distribution, shape the amplitude distribution in a predetermined frequency region, inversely Fourier-transform the phase distribution and the shaped amplitude distribution to obtain a second interference signal, and determine the surface shape of the substrate on the basis of the second interference signal, wherein the computer obtains an abnormal frequency region in the predetermined frequency region on the basis of the phase distribution obtained by Fourier-transforming the first interference signal, and shapes the amplitude distribution on the basis of information on the abnormal frequency region, and the abnormal frequency region includes a frequency region in which a slope of a curve expressing the phase distribution in the predetermined frequency region differs from a median value of the slope of the curve by a predetermined amount or more.

According to the fifth aspect of the present invention, there is provided a shape measuring apparatus for measuring a surface shape of a substrate having a surface coated with a film, comprises:

an interferometer configured to split broadband light from a light source into measurement light and reference light, and to sense light formed by the measurement light from the surface of the substrate and the reference light by a photoelectric converter interference; and a computer configured to Fourier-transform a first interference signal sensed by the photoelectric converter to obtain a phase distribution and an amplitude distribution, shape the amplitude distribution in a predetermined frequency region, inversely Fourier-transform the phase distribution and the shaped amplitude distribution to obtain a second interference signal, and determine the surface shape of the substrate on the basis of the second interference signal, wherein the computer obtains an abnormal frequency region in the predetermined frequency region on the basis of the phase distribution obtained by Fourier-transforming the first interference signal, and shapes the amplitude distribution on the basis of information on the abnormal frequency region, and the abnormal frequency region includes a frequency region in which a ratio of an amplitude of the amplitude distribution in the predetermined frequency region, which is obtained by Fourier-transforming the first interference signal, to a reference amplitude is not more than a predetermined value.

According to the sixth aspect of the present invention, there is provided an apparatus for measuring a surface shape of a substrate having a surface coated with a film, comprises:

an interferometer configured to split broadband light from a light source into measurement light and reference light, and to sense interference light formed by the measurement light from the surface of the substrate and the reference light by a photoelectric converter; and a computer configured to Fourier-transform a first interference signal sensed by the photoelectric converter to obtain a phase distribution and an amplitude distribution, shape the amplitude distribution in a predetermined frequency region, inversely Fourier-transform the phase distribution and the shaped amplitude distribution to obtain a second interference signal, and determine the surface shape of the substrate on the basis of the second interference signal, wherein the computer shapes the amplitude distribution obtained by Fourier-transforming the first interference signal, on the basis of a spectral reflection characteristic of the surface of the substrate.

According to the present invention, it is possible to, for example, obtain a high-contrast interference signal by signal processing.

Further features of the present invention will become apparent from the following description of exemplary embodiments with reference to the attached drawings.

BRIEF DESCRIPTION OF THE DRAWINGS

FIG. 13 shows a signal obtained by normalizing the signal shown in FIG. 11;

FIG. 30 shows an amplitude distribution shaping sequence according to the third embodiment;

DESCRIPTION OF THE EMBODIMENTS

Preferred embodiments of the present invention will be described below with reference to the accompanying drawings.

Information obtained by Fourier-transforming (strictly speaking, complex-Fourier-transforming) a white light interference signal (that is, an interferogram) indicates the spectral distribution characteristic of an interferometer used. This fact will be explained first.

A white light interference signal in Mirau interference, which is detected by driving, for example, a piezoelectric element to change the interference condition (that is, the light path length difference between two light beams), is the sum of the light interference intensities at the respective wavelengths (frequencies) of white light. When the white light interference signal is Fourier-transformed, it is possible to obtain information on the amplitude and phase at a frequency corresponding to each wavelength.

An amplitude distribution (the amplitude dependence on the frequency) which uses the frequency as a parameter depends on the characteristic (measurement condition) of an interferometer. More specifically, the amplitude distribution depends on, for example, the spectral distribution of a light source, the spectral transmittance of an optical system, the spectrophotoelectric conversion efficiency of a photoelectric converter of an image sensor, and the spectral reflectance of a measurement target surface.

Figure 4:
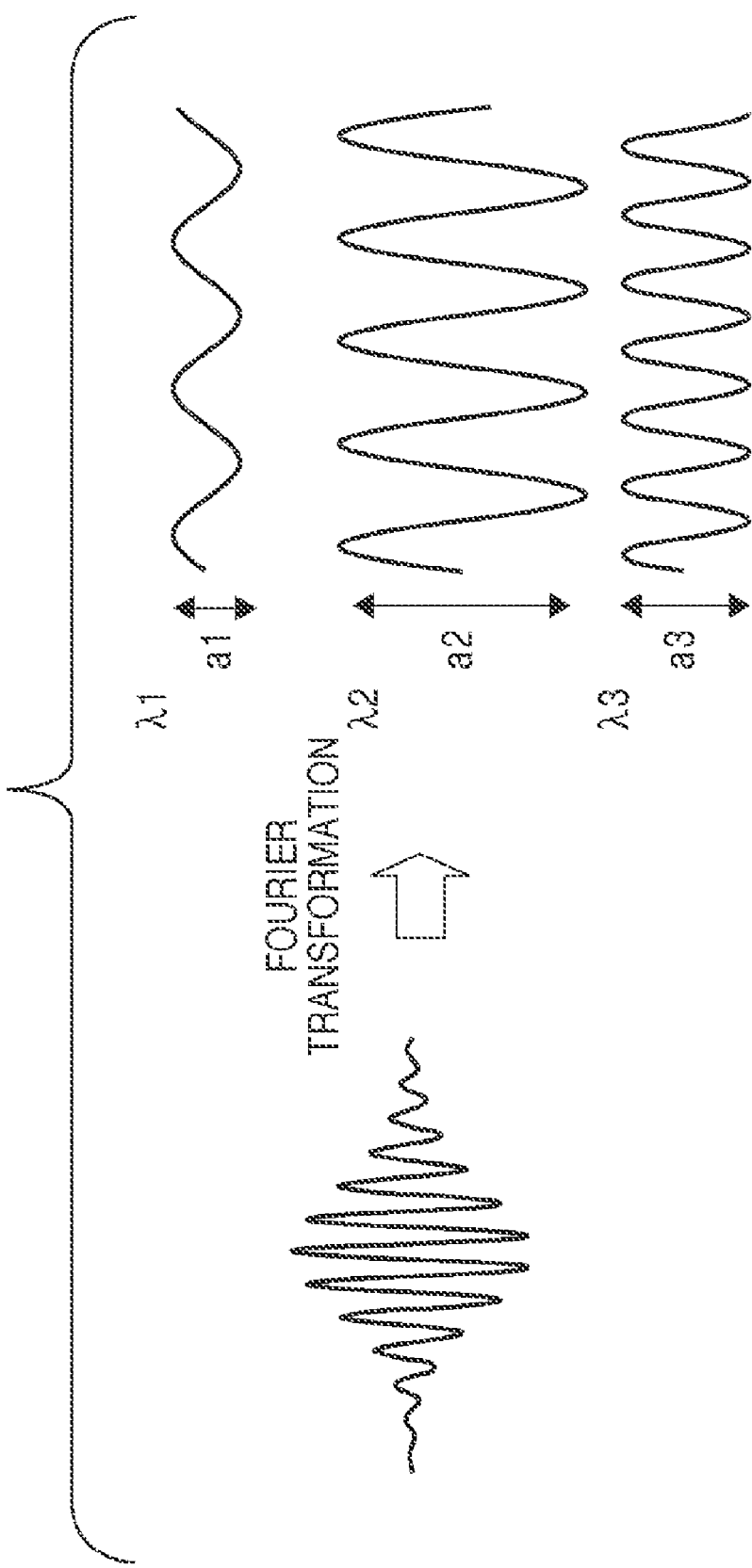
FIG. 4 illustrates the components of an interference signal at wavelengths $\lambda 1$, $\lambda 2$, and $\lambda 3$ upon Fourier-transforming it.

Information obtained by Fourier-transforming a white light interference signal (that is, an interferogram) contains information indicating the spectral distribution characteristic of an interferometer. This fact will be explained in more detail with reference to the conceptual views in FIGS. 4 and 5. The left side of FIG. 4 shows a white light interference signal. The right side of FIG. 4 shows the components of the white light interference signal at wavelengths λ1, λ2, and λ3 upon Fourier-transforming it. Amplitudes a1, a2, and a3 are calculated from the real part and imaginary part of the result obtained by Fourier-transforming the white light interference signal. That is, the amplitudes a1, a2, and a3 are proportional to the magnitudes of the amplitudes at frequencies f1, f2, and f3 corresponding to the wavelengths λ1, λ2, and λ3.

Figure 5:
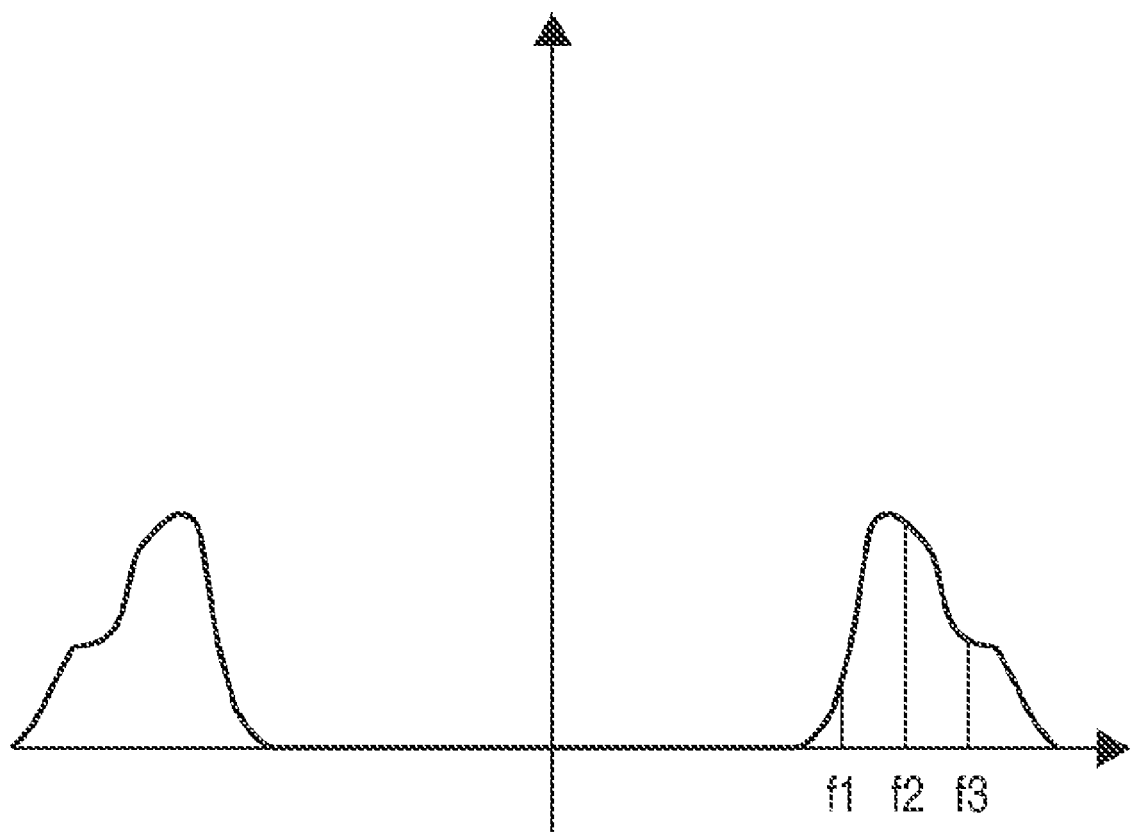
FIG. 5 illustrates an amplitude distribution obtained by Fourier-transforming an interference signal.

FIG. 5 shows an amplitude distribution obtained by Fourier-transforming the white light interference signal. The frequencies f1, f2, and f3 correspond to the wavelengths λ1, λ2, and λ3, respectively, shown in FIG. 4. The amplitudes at the frequencies f1, f2, and f3 correspond to the amplitudes a1, a2, and a3, respectively, shown in FIG. 4. Referring to FIG. 4, the phases of the components of the white light interference signal at the wavelengths λ1, λ2, and λ3 are calculated from the real part and imaginary part of the result obtained by Fourier-transforming it.

The fact that an amplitude distribution obtained by Fourier-transforming the white light interference signal has a convex shape means that the amplitude changes depending on the frequency; in other words, that the white light interference signal is detected by an interferometer having a spectral distribution characteristic shifted from that of white light.

The phase of the white light interference signal shown on the left side of FIG. 4 corresponds to that of the amplitude distribution obtained by Fourier-transforming the white light interference signal, and is independent of the amplitude. On the other hand, the shape of the envelope of the white light interference signal corresponds to the amplitude in the result obtained by Fourier-transforming the white light interference signal, and is independent of the phase.

In this embodiment, the phase of the result obtained by Fourier transformation remains the same, whereas the amplitude is shaped to take a constant value relative to the frequency. After that, inverse Fourier transformation is executed to obtain a high-contrast white light interference signal.

To be precise, the term "broadband light" will be used instead of the term "white light" hereinafter. This is because the effect of the present invention can be obtained even by using broadband light in a wavelength range not containing blue light (e.g., 500 nm to 800 nm). This is also because broadband light can be defined as light containing a plurality of wavelengths (or frequencies) which can be separated by signal processing using a computer.

Figure 1:
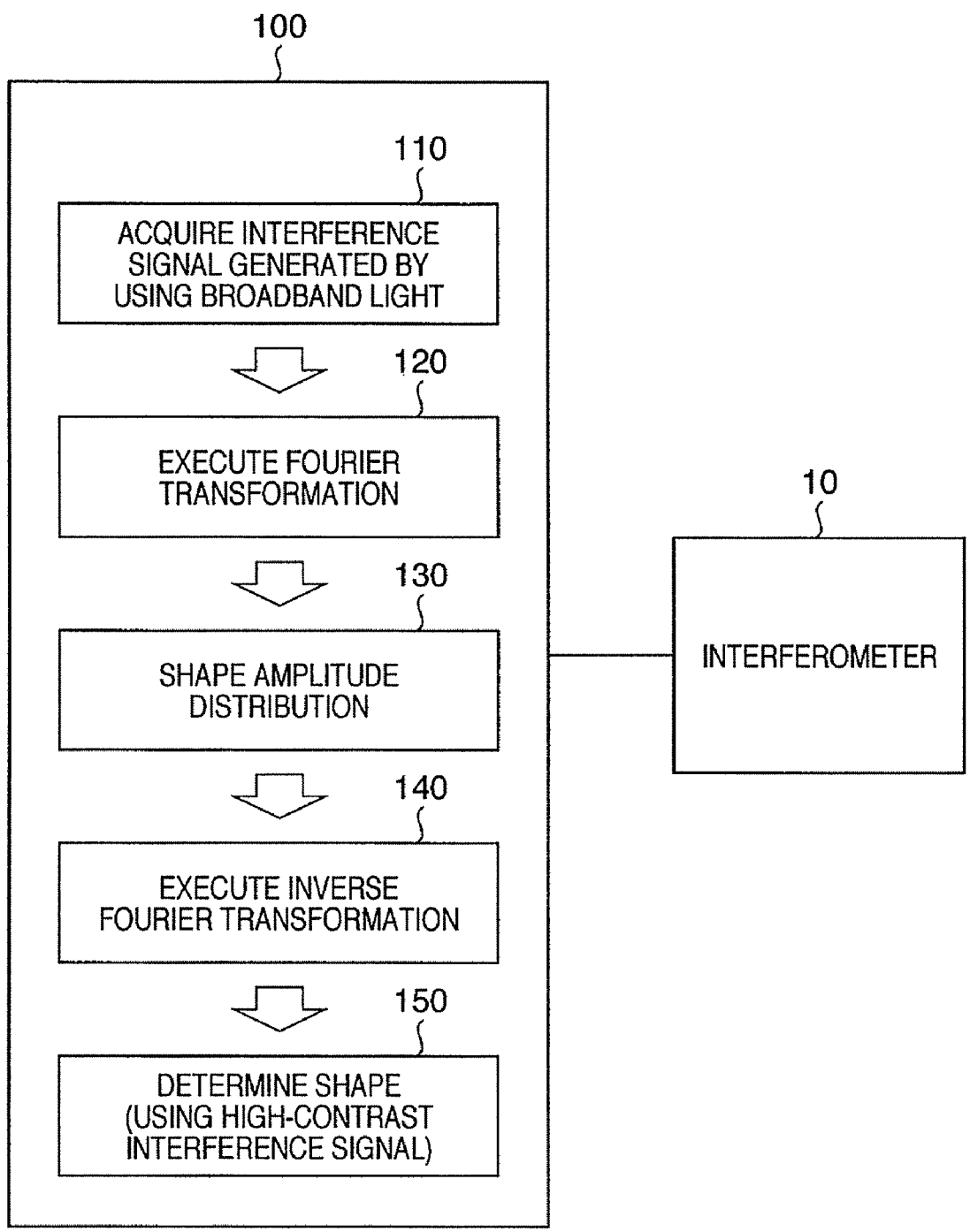
FIG. 1 shows the schematic arrangement of a shape measuring apparatus according to a preferred embodiment of the present invention.
Figure 6:
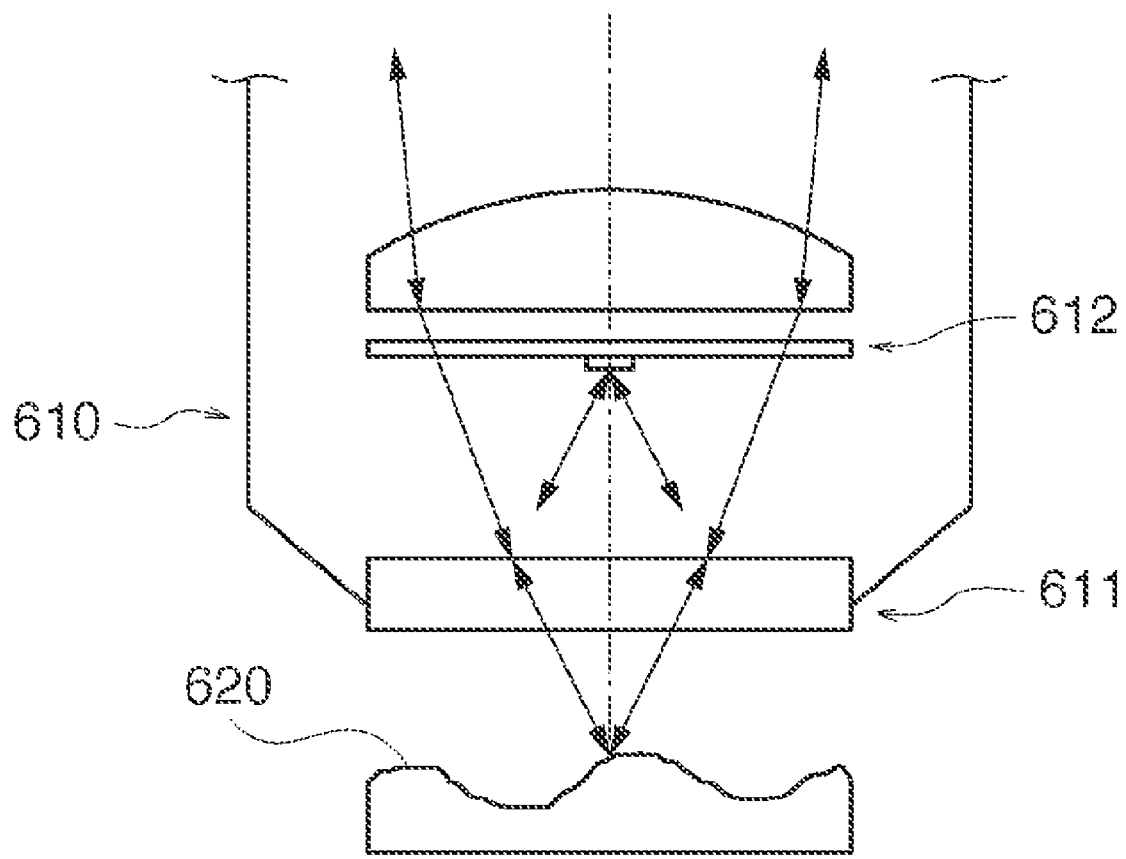
FIG. 6 shows the principle of a Mirau interferometer.
Figure 7:
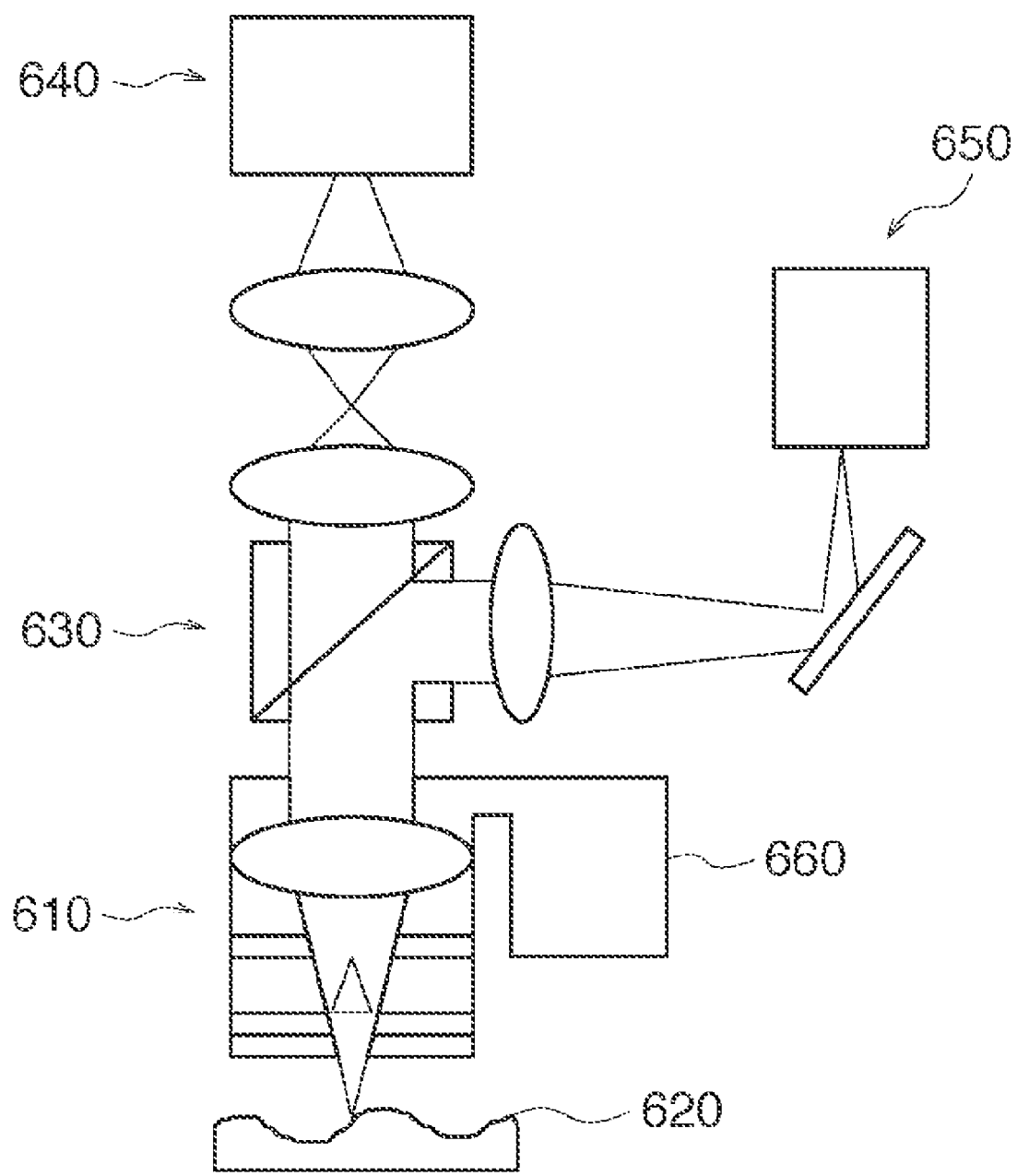
FIG. 7 shows the schematic arrangement of the Mirau interferometer.

FIG. 1 shows the schematic arrangement of a shape measuring apparatus according to a preferred embodiment of the present invention. A shape measuring apparatus 200 according to a preferred embodiment of the present invention comprises an interferometer 10 and a computer 100 which generates information indicating the shape of a measurement target surface on the basis of a signal output from the interferometer 10. The interferometer 10 controls a photoelectric converter (typically, an image sensor in which photoelectric converters are arrayed two-dimensionally) to sense interference light formed by measurement light from a measurement target surface and reference light from a reference surface, while changing the light path length of the measurement light or the reference light. Measurement light and reference light are generated from broadband light. After being reflected by the measurement target surface, the measurement light interferes with the reference light to form interference light. When an image sensor in which photoelectric converters are arrayed two-dimensionally is used, the measurement target surface is tilted relative to the reference surface so that the measurement light and reference light have a wavefront angular difference. This makes it possible to differentiate the light path lengths of measurement light beams which enter the respective photoelectric converters in the tilt direction. This arrangement obviates the need to measure the interference light using the image sensor while changing the light path length of the measurement light or reference light. A preferable example of the interferometer 10 is a Mirau interferometer as illustrated in FIGS. 6 and 7. Although the interferometer 10 is assumed to be the one illustrated in FIGS. 6 and 7 for an illustrative description hereinafter, various kinds of interferometers can be used as the interferometer 10.

The computer 100 can execute interference signal acquisition step 110, Fourier transformation step 120, shaping step 130, inverse Fourier transformation step 140, and shape determination step 150. The computer 100 can be typically characterized by installing programs (software) which handle interference signal acquisition step 110, Fourier transformation step 120, shaping step 130, inverse Fourier transformation step 140, and shape determination step 150. In other words, the computer 100 comprises an interference signal acquisition unit, Fourier transformation unit, shaping unit, inverse Fourier transformation unit, and shape determination unit. The interference signal acquisition unit, Fourier transformation unit, shaping unit, inverse Fourier transformation unit, and shape determination unit execute interference signal acquisition step 110, Fourier transformation step 120, shaping step 130, inverse Fourier transformation step 140, and shape determination step 150, respectively.

Figure 10:
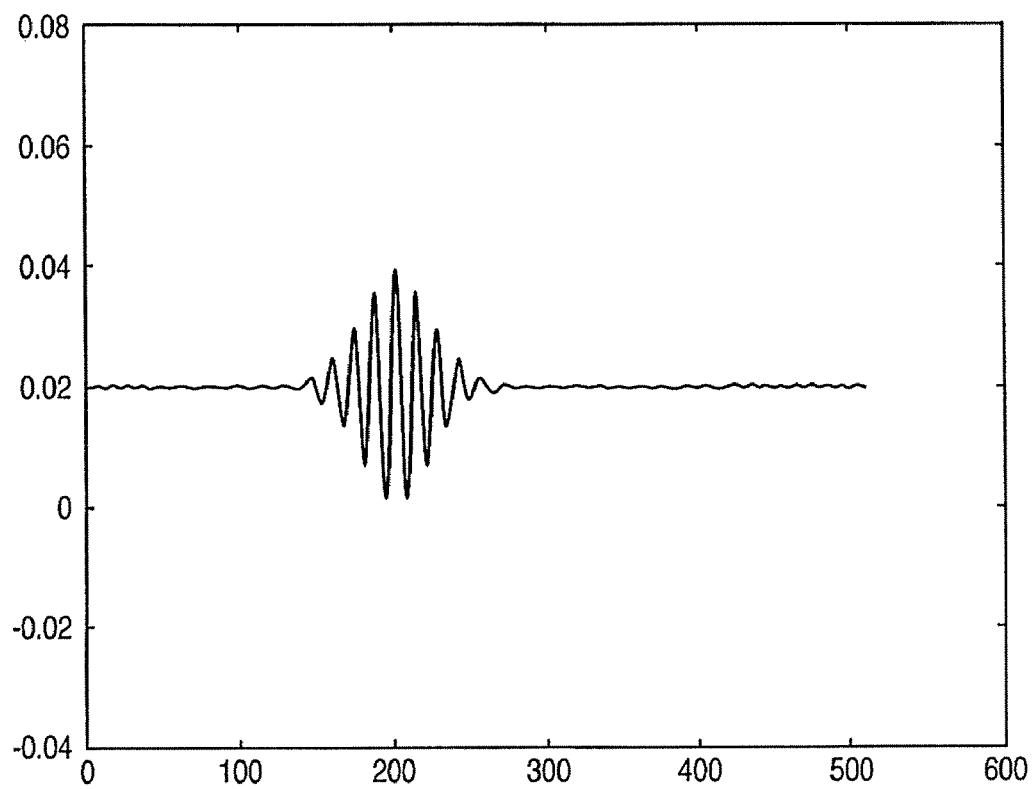
FIG. 10 shows an example of an interference signal obtained by using broadband light.

FIG. 10 shows an example of an interference signal obtained by using broadband light by simulation. Assume here that the interferometer 10 was the Mirau interferometer shown in FIGS. 6 and 7, and the light path length was changed by driving an objective lens 610.

In the simulation, the broadband light used had a center wavelength of 550 nm and a Gaussian light intensity distribution (6σ=300 nm). The broadband light struck a measurement target surface 620 nearly perpendicularly. The wavelength pitch was 10 nm. The reflectances of the measurement target surface 620 and an internal reference mirror 612 were 1.5 at each wavelength. The pitch at which a driving element (piezoelectric element) drove the objective lens 610 was 20 nm.

Figure 14:
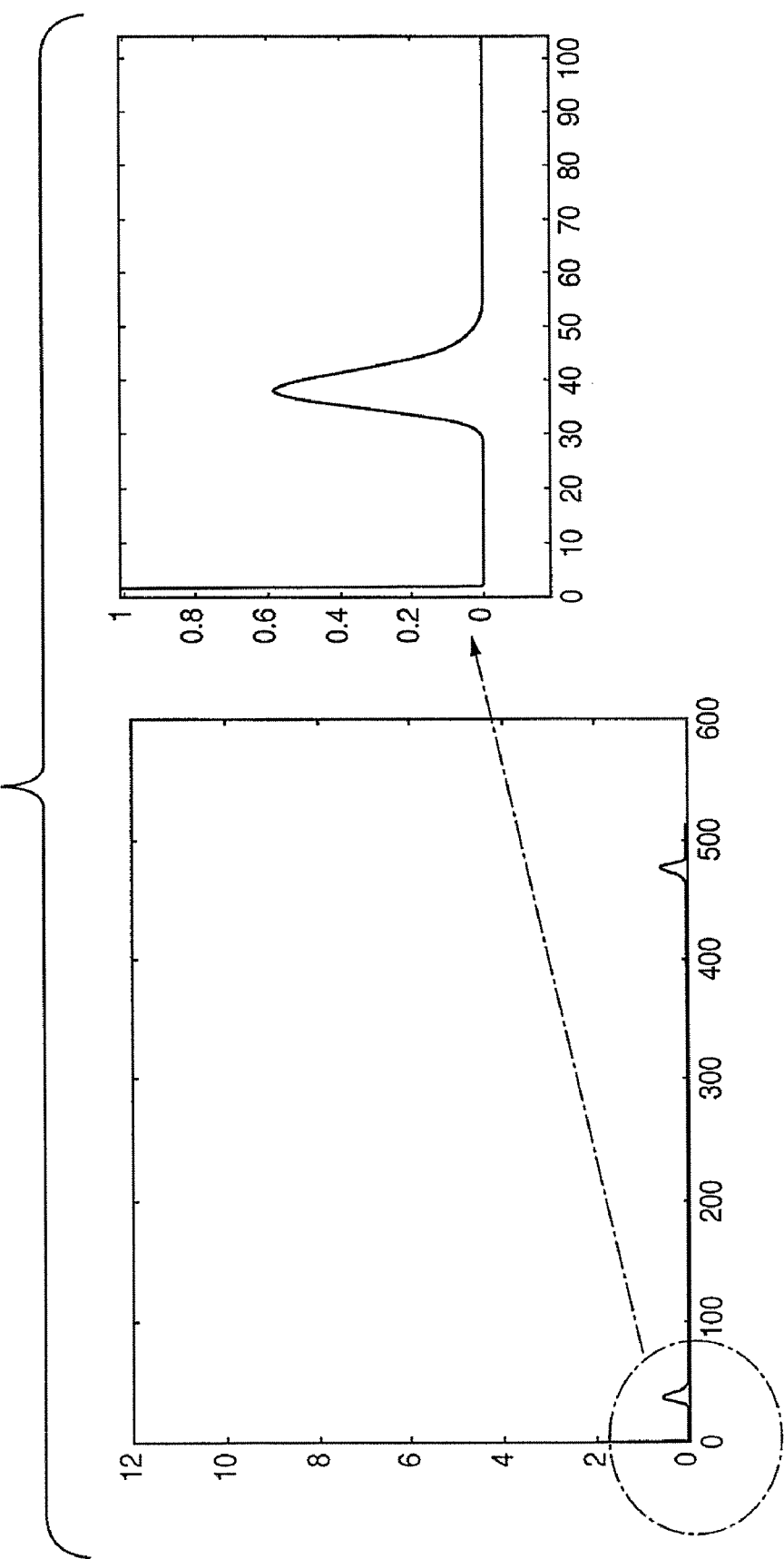
FIG. 14 shows an amplitude distribution obtained by Fourier-transforming an interference signal generated by broadband light.

FIG. 14 shows an amplitude distribution obtained by Fourier-transforming an interference signal (first interference signal) illustrated in FIG. 10, which is obtained by using the above-described broadband light. The right side of FIG. 14 shows an enlarged view of its left side. FIG. 14 reveals that the amplitude distribution has a Gaussian distribution shape reflecting the spectral distribution of the light source. In interference signal acquisition step 110, the computer 100 acquires the interference signal (first interference signal) as illustrated in FIG. 10 from the interferometer 10. In Fourier transformation step 120, the computer 100 Fourier-transforms the interference signal acquired in interference signal acquisition step 110, to obtain a phase distribution and an amplitude distribution as illustrated in FIG. 14.

Figure 15:
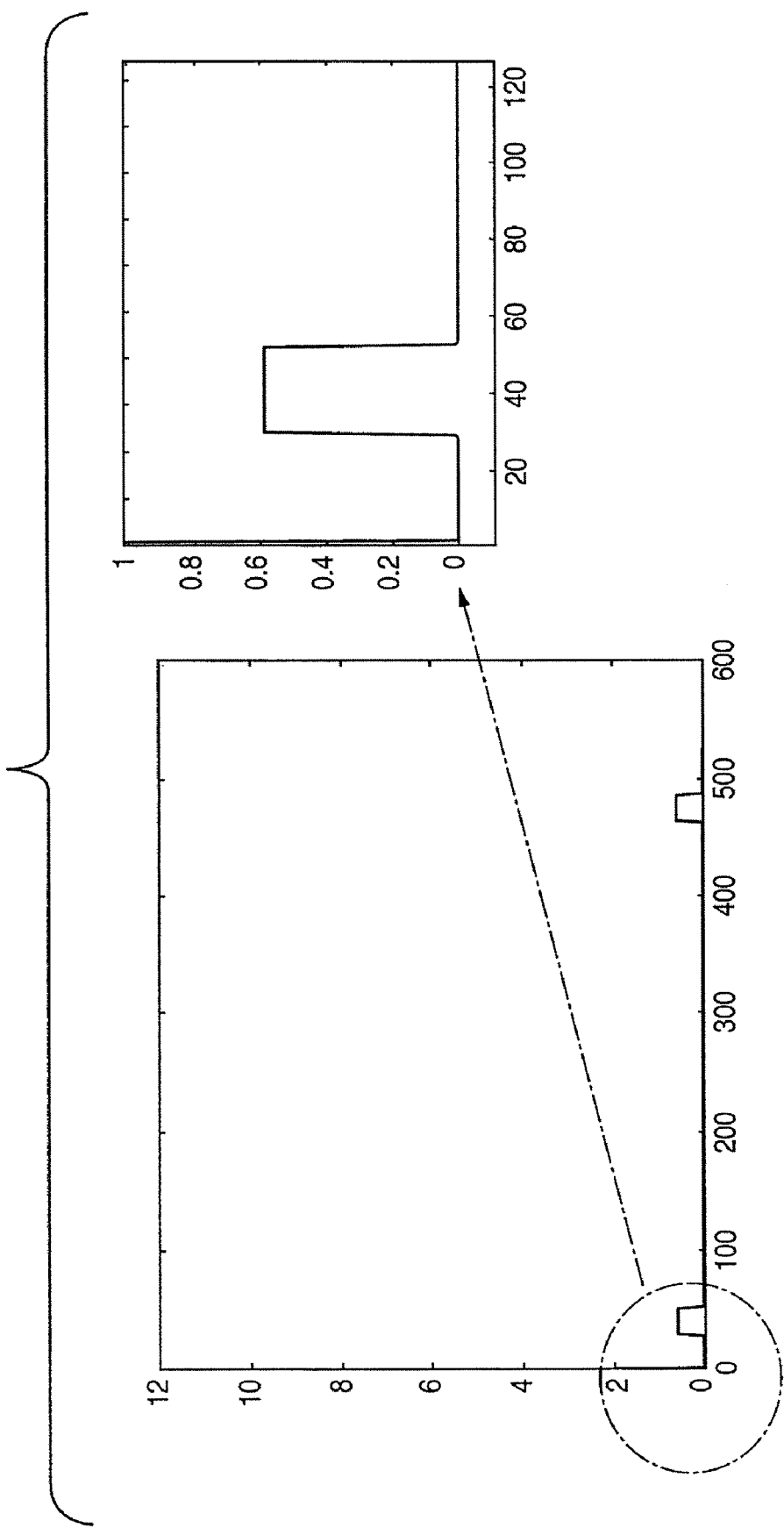
FIG. 15 illustrates a distribution function W.

In shaping step 130, the computer 100 shapes the amplitude distribution obtained by Fourier-transforming the interference signal in Fourier transformation step 120. This shaping can be executed so as to form an amplitude distribution having a flat portion as illustrated in FIG. 15 or form an amplitude distribution having a wider flat portion than before. The shaping is preferably executed so as to prevent both ends of the flat portion from exhibiting differential discontinuity.

Figure 2:
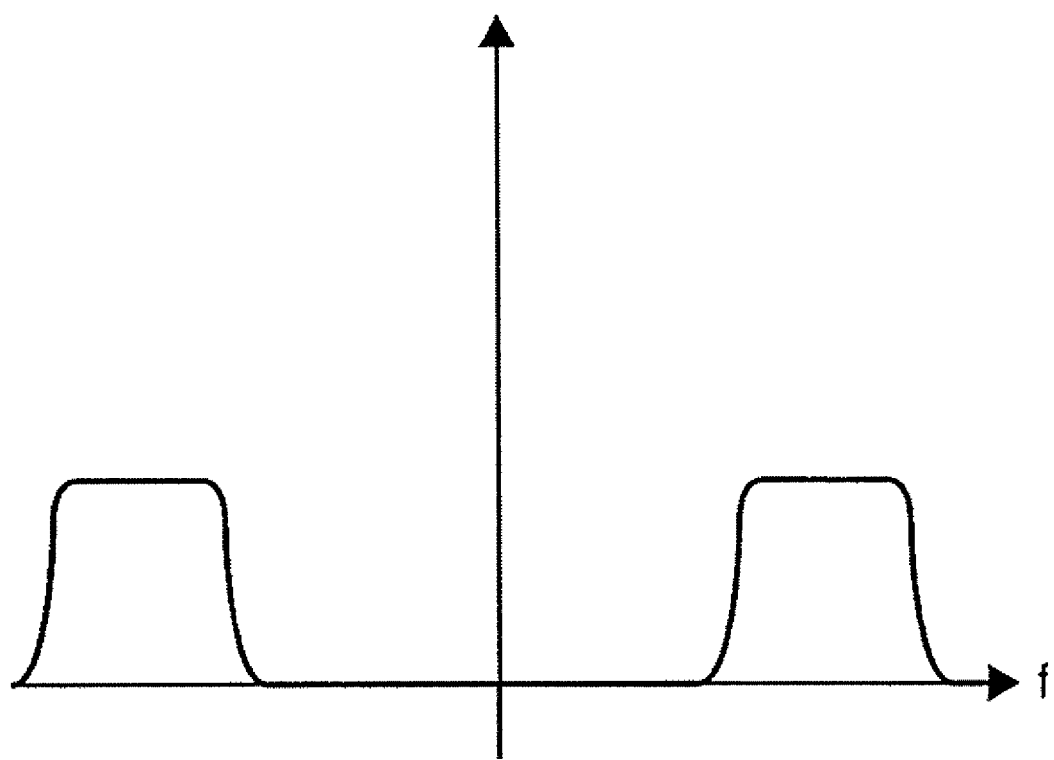
FIG. 2 illustrates a distribution function W used to shape an amplitude distribution obtained by Fourier transformation.
Figure 3:
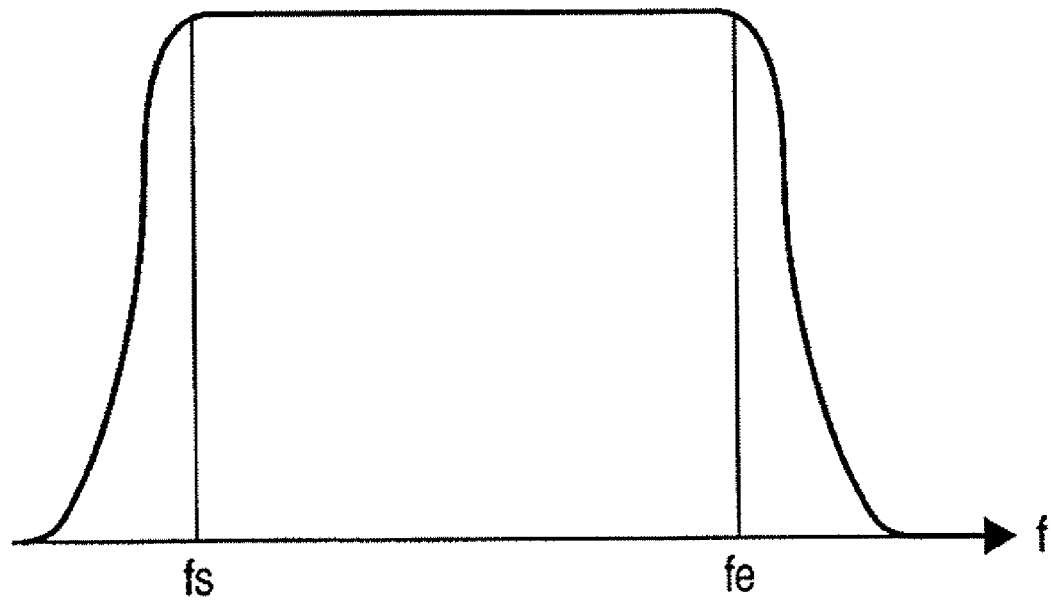
FIG. 3 is a partially enlarged view of FIG. 2.

The shaping will be explained in more detail with reference to FIGS. 2 and 3. FIGS. 2 and 3 illustrate the shaped amplitude distribution. FIG. 3 enlarges the part with positive frequency f shown in FIG. 2.

In shaping step 130, the amplitude distribution is shaped in accordance with, for example, the following distribution function W:

$$W(f) = \text{EXP}(-(f-fs)^{2/\sigma}) : f < fs$$

$$W(f) = 1 : fs \leq f \leq fe$$

$$W(f) = \text{EXP}(-(f-fe)^{2/\sigma}) : f > fs$$

where σ is the convergence speed of the Gaussian function and takes a value five times the frequency pitch in this case.

This means that the amplitude at each frequency is changed to match that of the distribution function W, or that the amplitude at each frequency is substituted by that of the distribution function W. Note that the phase distribution obtained by Fourier-transformation in Fourier transformation step 120 is not changed (manipulated) in shaping step 130.

Determination of frequencies fs and fe of the distribution function W will be explained later.

Figure 11:
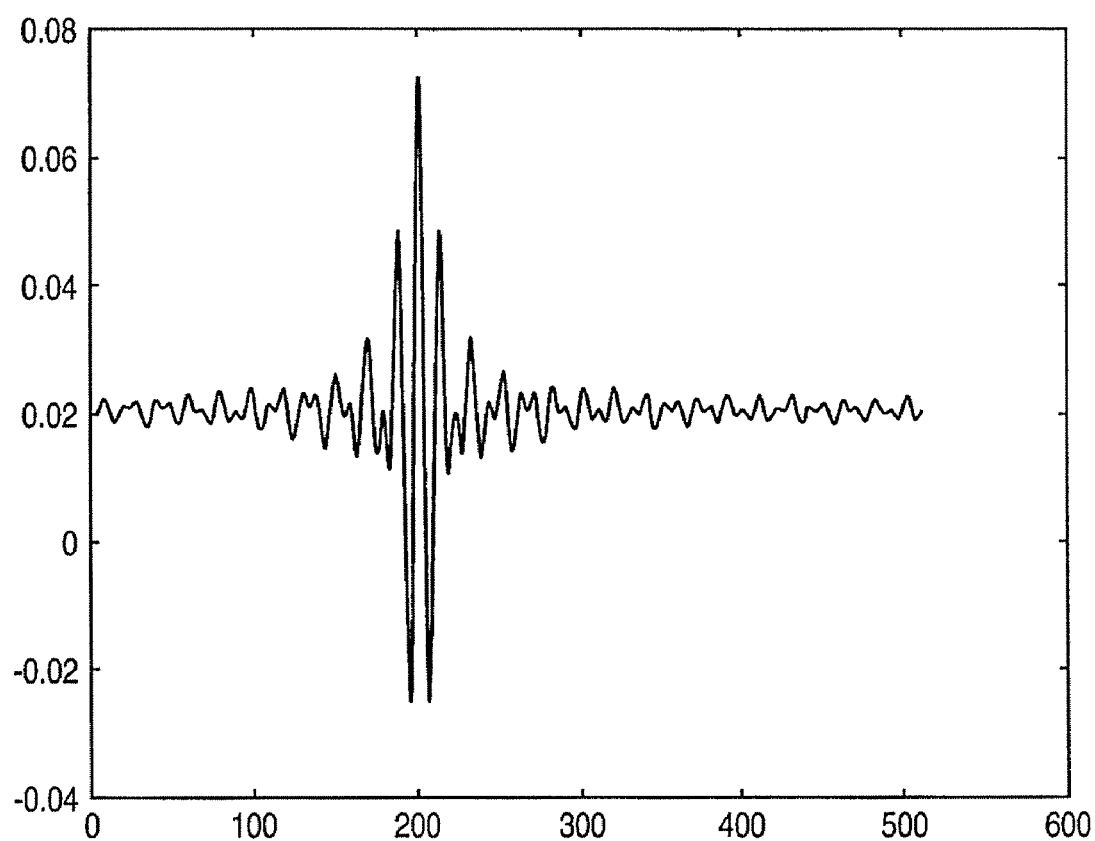
FIG. 11 illustrates a high-contrast interference signal obtained by adopting the present invention.

In inverse Fourier transformation step 140, the computer 100 inversely Fourier-transforms the amplitude of the amplitude distribution shaped in shaping step 130 and the phase of the phase distribution obtained in Fourier transformation step 120. With this operation, an interference signal (second interference signal) as illustrated in FIG. 11 is obtained. As is obvious from FIG. 10 (before processing) and FIG. 11 (after processing), the computer 100 increases the contrast of the interference signal by signal processing.

In shape determination step 150, the computer 100 determines the three-dimensional shape of the measurement target surface 620 on the basis of the interference signal obtained by inverse Fourier transformation.

Figure 12:
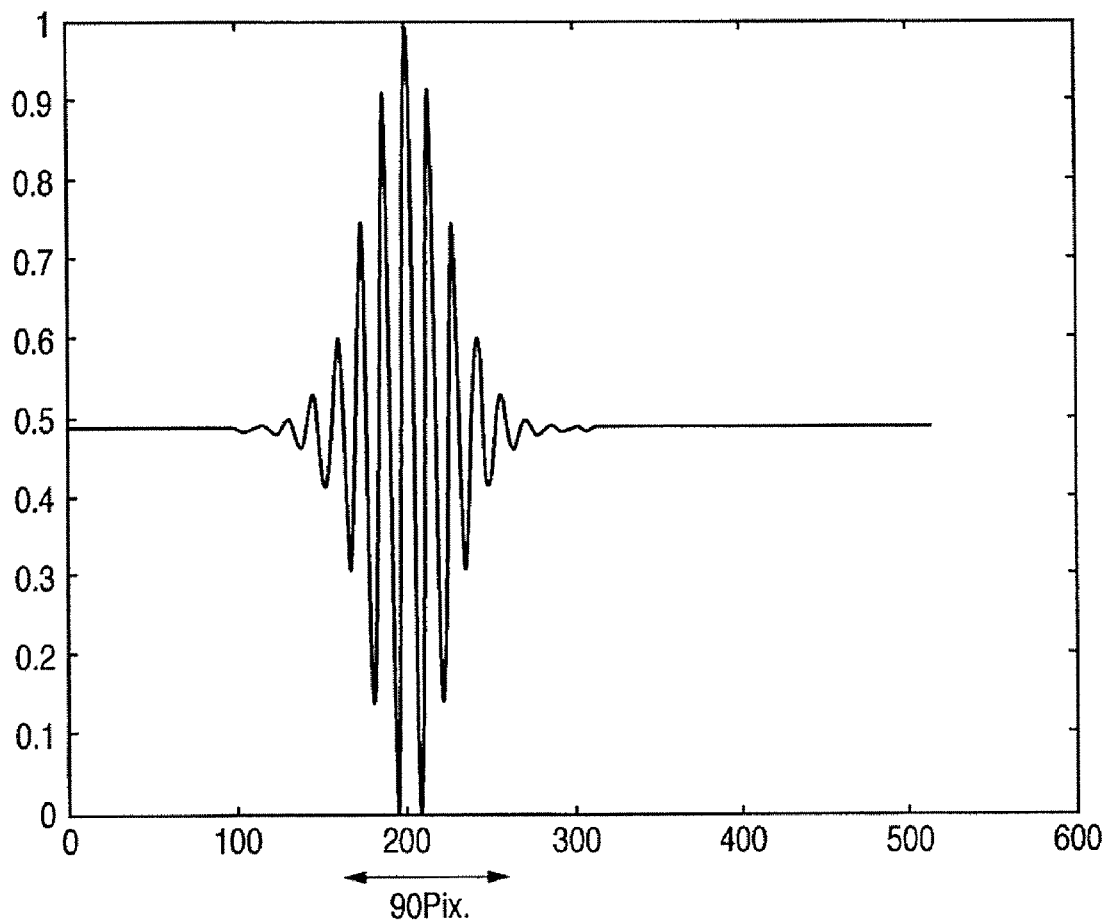
FIG. 12 shows a signal obtained by normalizing the signal shown in FIG. 10.

The effect of increasing the contrast of the interference signal using the computer 100 will now be explained. FIGS. 12 and 13 show the results of normalizing the signals shown in FIG. 10 (before processing) and FIG. 11 (after processing) assuming that their maximum intensities are one.

Figure 8:
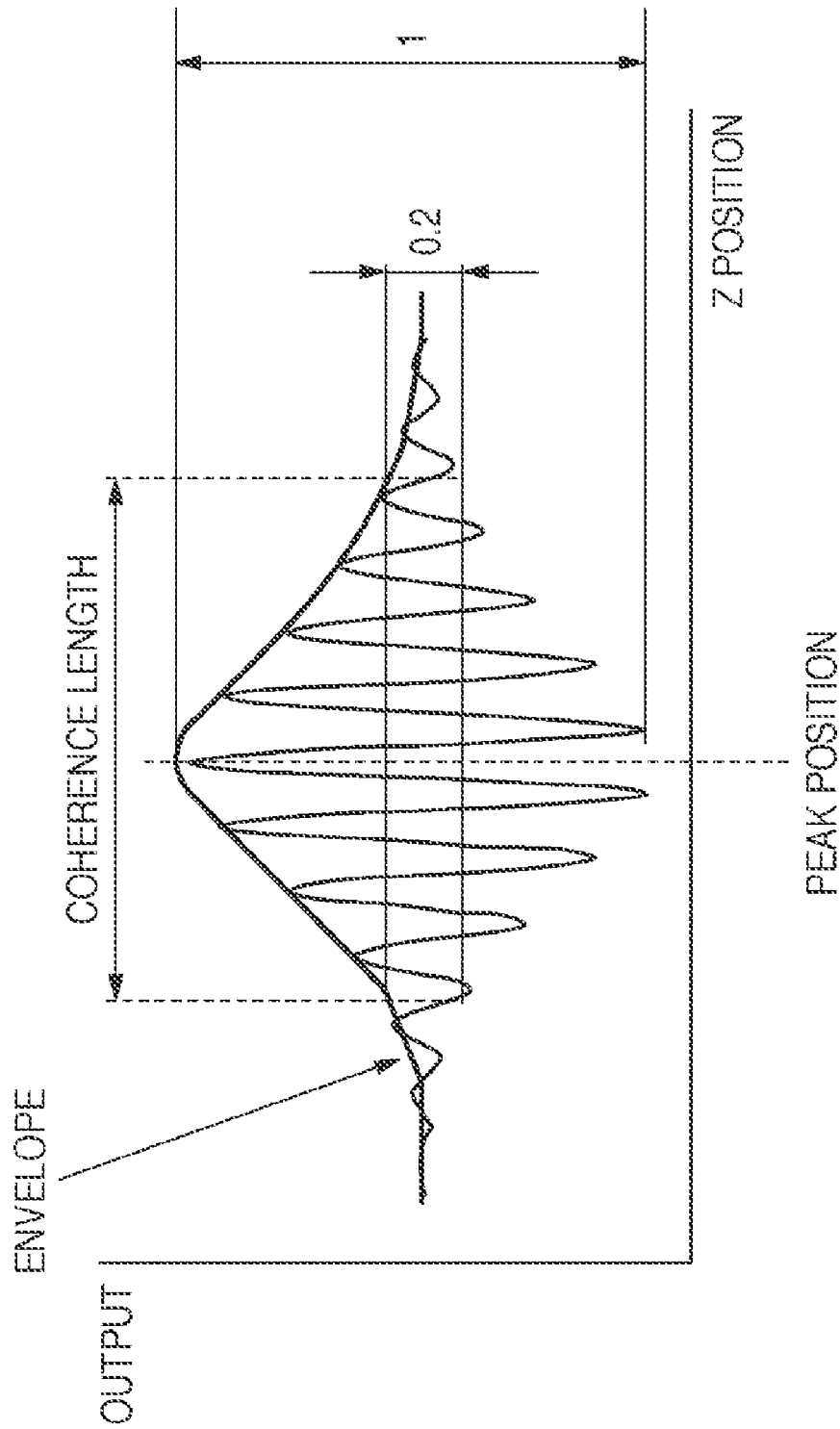
FIG. 8 illustrates the interference signal, envelope, and coherence length.

The "coherence length" is defined as the length, along the abscissa (vertical position), of the signal in a frequency region having amplitudes of 20% or more of that at the maximum intensity, as shown in FIG. 8. In this case, the measured coherence lengths of the signals shown in FIGS. 12 and 13 are about 3.6 μm and 2.6 μm, respectively. That is, the coherence length of the signal shown in FIG. 13 is shortened by about 30% (1-2.6/3.6).

To determine the shape of the measurement target surface in shape determination step 150 on the basis of an interference signal (second interference signal) using high-contrast broadband light, it is possible to adopt the above-described FDA method, a phase shift method, or a Fourier transformation method.

How to determine the frequencies fs and fe at both ends of the flat portion of the distribution function W to shape the amplitude will be explained next.

To obtain a high-contrast signal, it is important to set the frequencies fs and fe at both ends of the flat portion of the distribution function W so as to sufficiently take advantage of information on a convex portion of the amplitude distribution illustrated in FIG. 5 or 14, which is obtained by Fourier-transforming an interference signal generated by using broadband light. On the other hand, use of an excessively wide flat portion for the distribution function W, which decreases the measurement precision, should be avoided. The use of signal components other than the convex portion decreases the measurement precision when information containing no phase information is added.

To avoid this situation, the frequencies fs and fe are preferably set on the basis of the degree of phase change of a phase distribution obtained by Fourier-transforming an interference signal generated by using broadband light. According to the principle of white light interference, in the ideal case the phase of an interference signal at each wavelength gradually changes as the wavelength changes. The above-described FDA uses this phenomenon. In view of this, the phase of a highly reliable frequency signal component is assumed to change gradually, and the frequencies at both ends of a frequency region in which a phase change exhibits high linearity are preferably set as the frequencies fs and fe. That is, the amplitude distribution is preferably shaped so as to form an amplitude distribution having a flat portion in a frequency region in which a curve expressing the phase distribution has a linearity higher than a reference value.

A high-linearity region and low-linearity region can be determined on the basis of, for example, whether a region of interest has a linearity higher than a reference value. More specifically, it is possible to determine that a region in which the derivative value of phase with respect to frequency is lower than a reference value has high linearity, whereas a region in which that value is higher than the reference value has low linearity.

Figure 16:
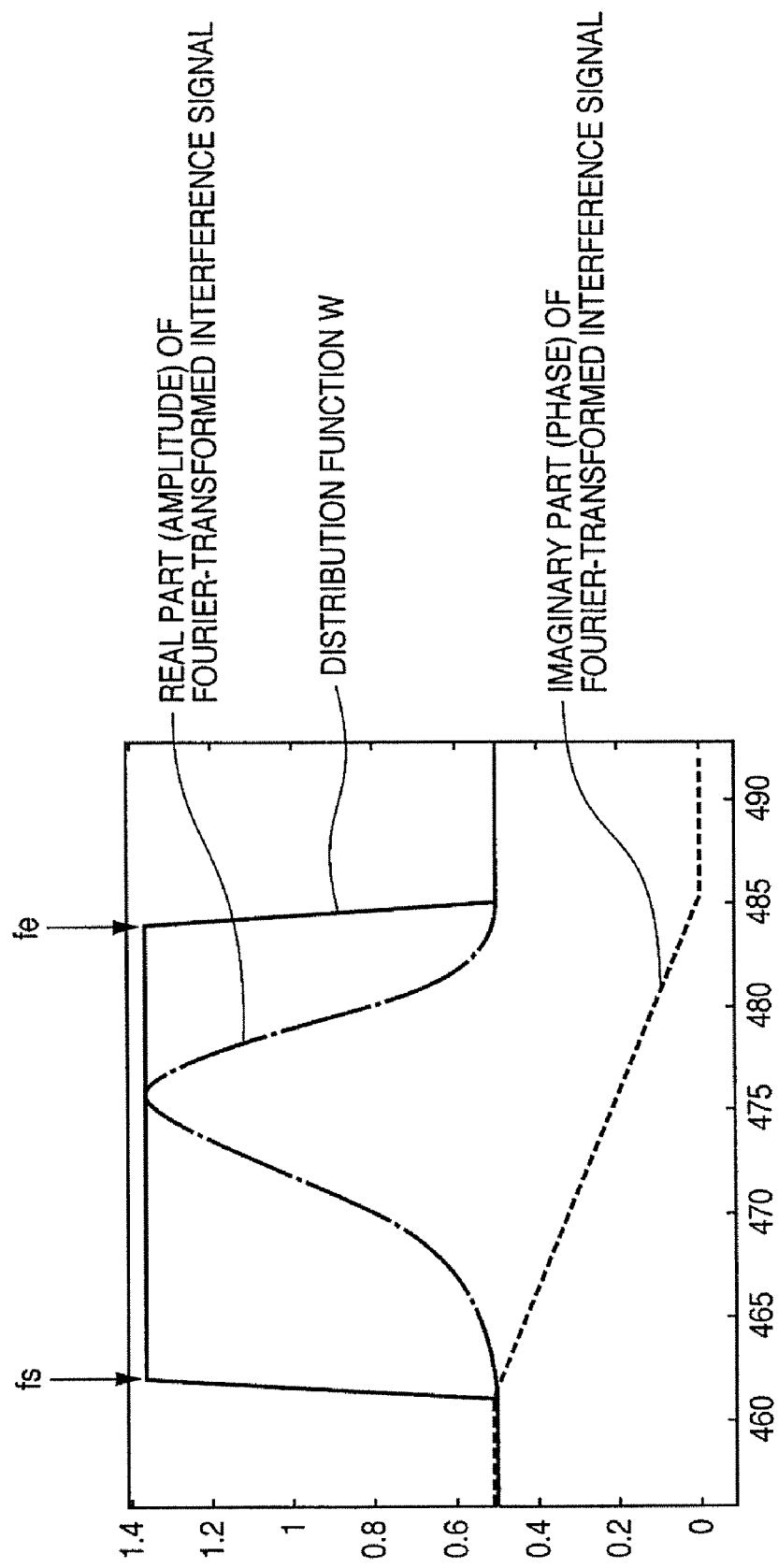
FIG. 16 illustrates the relationship between an amplitude distribution, distribution function W, and phase distribution obtained by Fourier transformation.

FIG. 16 shows amplitude and phase distributions obtained by Fourier-transforming the interference signal illustrated in FIG. 10. As is obvious from FIG. 16, the phase of the Fourier-transformed interference signal is nearly linear even in a region in which the amplitude after Fourier transformation is small. Hence, a distribution function W is preferably set such that the frequencies at both ends of a region in which the phase value changes nearly linearly become the frequencies fs and fe.

Although a Mirau type interference scheme has been exemplified, the present invention is not particularly limited to this. For example, the present invention is also applicable to other interference schemes of, for example, a Michelson type and Linnik type.

According to this embodiment, it is possible to, for example, obtain a high-contrast interference signal using broadband light without any influence of the spectral characteristics of a light source, optical system, and photoelectric converter.

[Example of Application to Lithography]

The present invention is also suitable to measure a specific surface of a vertical structure (stacked structure) formed by a plurality of transparent films (multilayer film).

Figure 17:
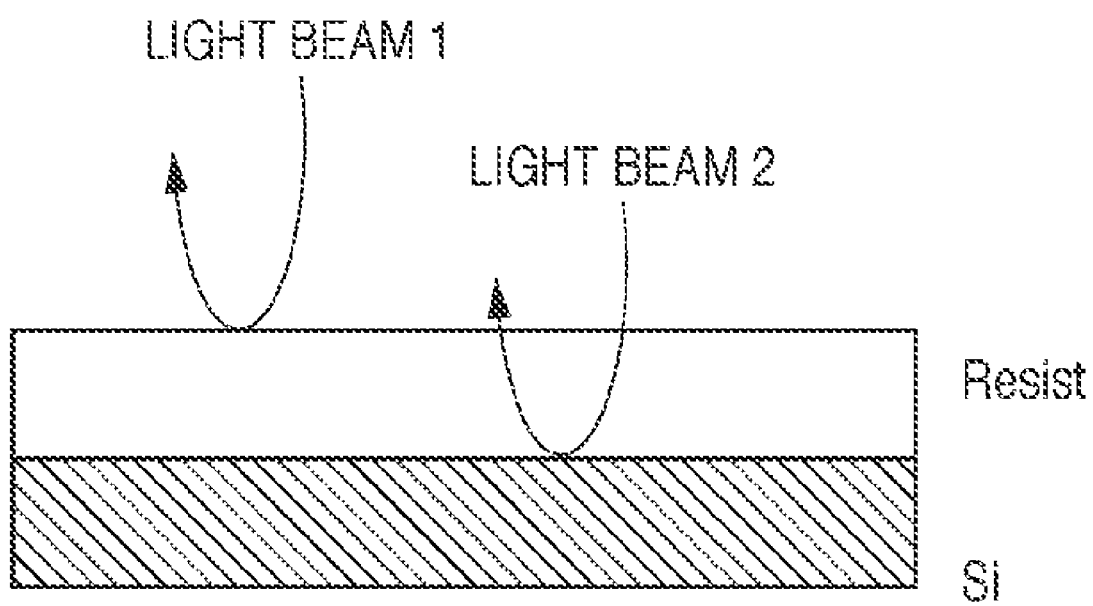
FIG. 17 schematically shows a state in which measurement light beams are reflected by a plurality of surfaces.

FIG. 17 illustrates a structure used for lithography in the manufacture of a semiconductor device and, more specifically, a structure in which a resist is applied on a silicon wafer. Consider a case in which light having a wavelength of about 500 nm is used to measure the surface shape of the resist. The resist used for the current lithography is exposed to exposure light having wavelengths of, for example, 365 nm, 248 nm, and 193 nm, but is transparent to measurement light having a wavelength of 500 nm. Accordingly, as schematically shown in FIG. 17, the structure generates not only a light beam reflected by the upper surface of the resist as indicated by light beam 1 but also a light beam reflected by the boundary surface between the silicon substrate and the lower surface of the resist as indicated by light beam 2. An interference image is thus formed by a total of three light beams, including a reference light beam (not shown). Since the interference image generates a measurement error, it is impossible to correctly measure the surface shape of the resist.

An effective technique as a countermeasure against this problem is a function which is called "Top Slice" or "Top Surface" and available from Zygo Corporation. US2005/0078318A1 discloses this technique.

Applying the present invention to the "Top Slice" function makes it possible to further improve the detection precision of the upper surface of the resist.

Figure 18A:
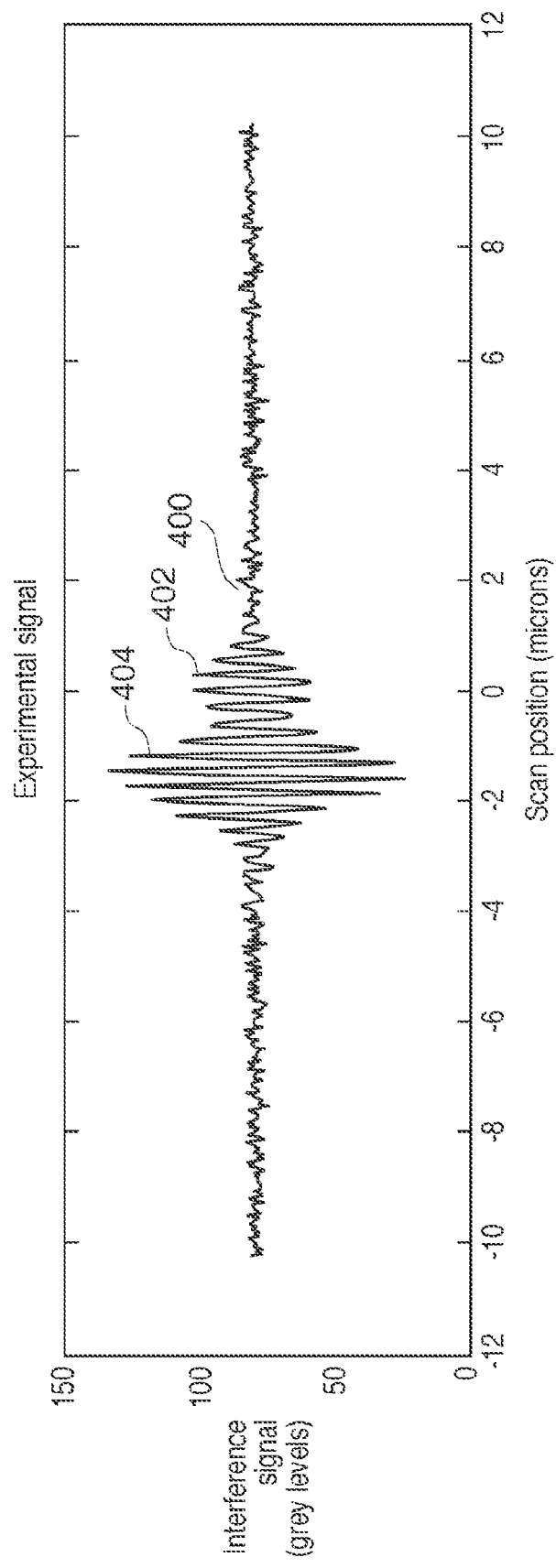
FIG. 18A shows the principle of Top Slice.

The function of "Top Slice" will be explained first. FIG. 18A shows an interference signal generated by using broadband light. Referring to FIG. 18A, the left side of the abscissa is the direction of the silicon substrate, and its right side is the direction of the upper surface of the resist. A peak 404 of the interference signal corresponds to the boundary surface between the silicon substrate and the lower surface of the resist, while a peak 402 of the interference signal corresponds to the upper surface of the resist. In other words, the signal shown in FIG. 18A includes two interference signal components. As the resist thickness decreases to the degree that the interference signal component corresponding to the boundary surface between the silicon substrate and the lower surface of the resist has an influence on that corresponding to the upper surface of the resist, the detection precision may deteriorate.

Figure 18B:
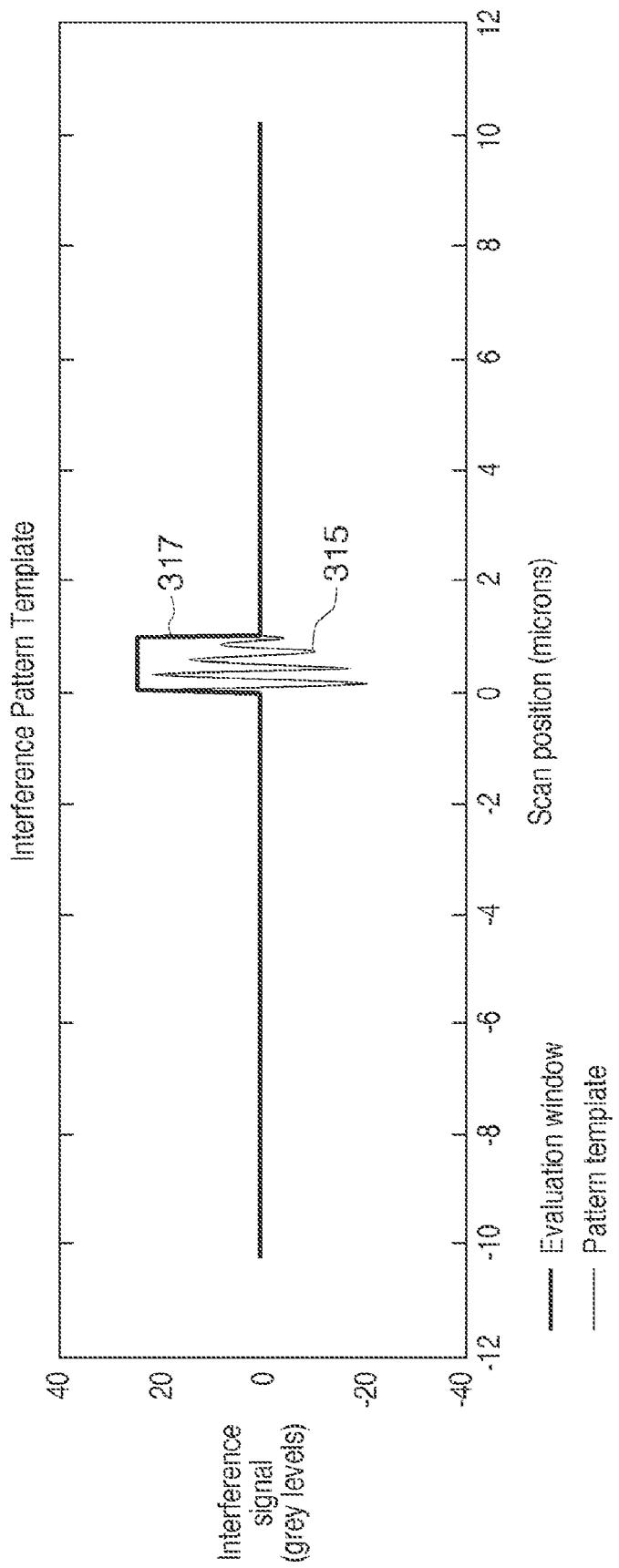
FIG. 18B shows the principle of Top Slice.
Figure 18C:
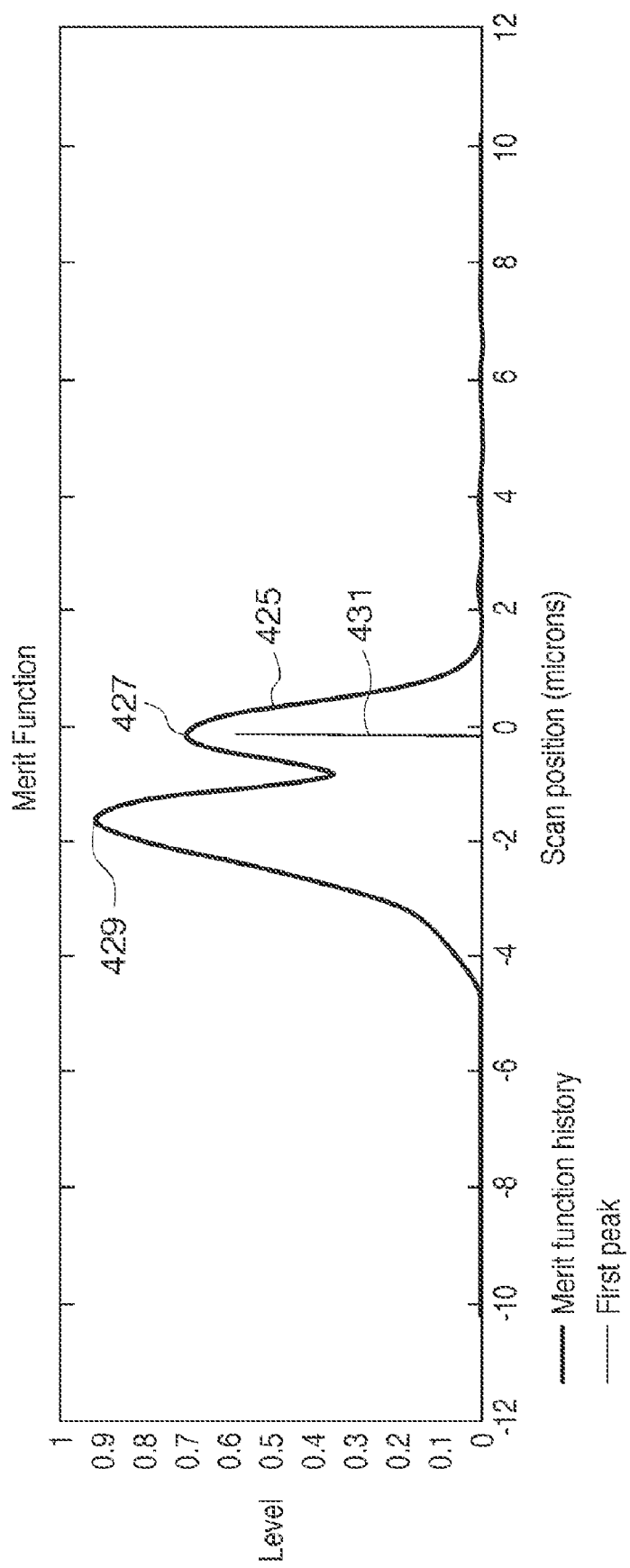
FIG. 18C shows the principle of Top Slice.

To avoid this situation, as shown in FIG. 18B, "Top Slice" uses a waveform 315 corresponding to the peak 402 (the peak corresponding to the upper surface of the resist) on the right side of the interference signal as a template. Matching processing is executed between the template and the signal shown in FIG. 18A. On the basis of the match degree (FIG. 18C), the upper surface of the resist (the position of the rightmost peak of FIG. 18C) is detected.

In this manner, this technique detects the uppermost surface of the stacked structure, hence it is called "Top Slice" or "Top Surface". To detect the boundary surface of the silicon substrate and the lower surface of the resist, the setting is changed so as to detect the position of the leftmost peak of FIG. 18C.

"Top Slice" can thus detect the uppermost surface on the basis of an interference signal generated by light beams reflected by a plurality of surfaces.

Even when "Top Slice" is used, the detection precision may deteriorate as the resist thickness further decreases and the interference signal component corresponding to the boundary surface between the silicon substrate and the lower surface of the resist has an influence on that corresponding to the upper surface of the resist.

In this case, the present invention can be adopted to generate a high-contrast signal, thereby improving the detection precision. More specifically, in shape determination step 150, the computer 100 selects one of a plurality of peaks of the envelope of an interference signal (second interference signal) generated by inverse Fourier transformation. On the basis of the selected peak, the computer 100 determines the shape of the measurement target surface.

In actual lithography, layers called an antireflection layer and cap layer are applied on the resist. These layers have almost the same indices as that of the resist. When the present invention is applied to even a stacked structure in which these layers are applied on the resist, it is possible to precisely measure the surface of the stacked structure.

First Embodiment

Figure 19:
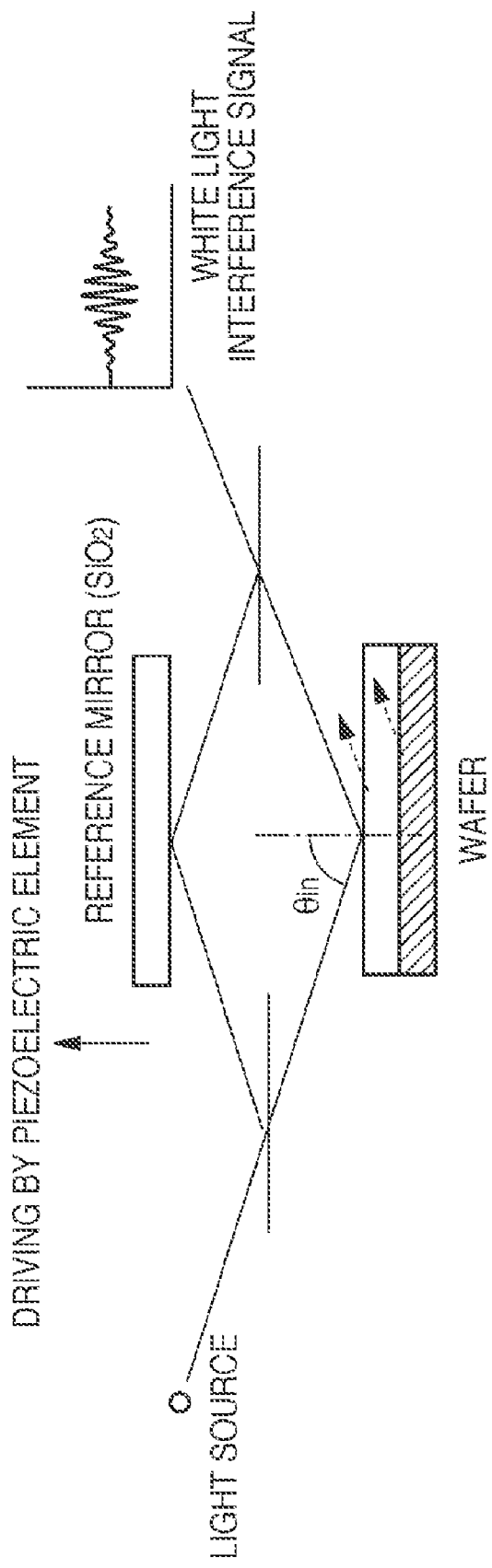
FIG. 19 illustrates an oblique-incidence optical system for interference measurement.

The present invention is not particularly limited to an arrangement in which broadband light strikes a measurement target surface nearly perpendicularly. As illustrated in FIG. 19, the present invention is also applicable to an interference system which obliquely irradiates a measurement target surface with broadband light.

Figure 20:
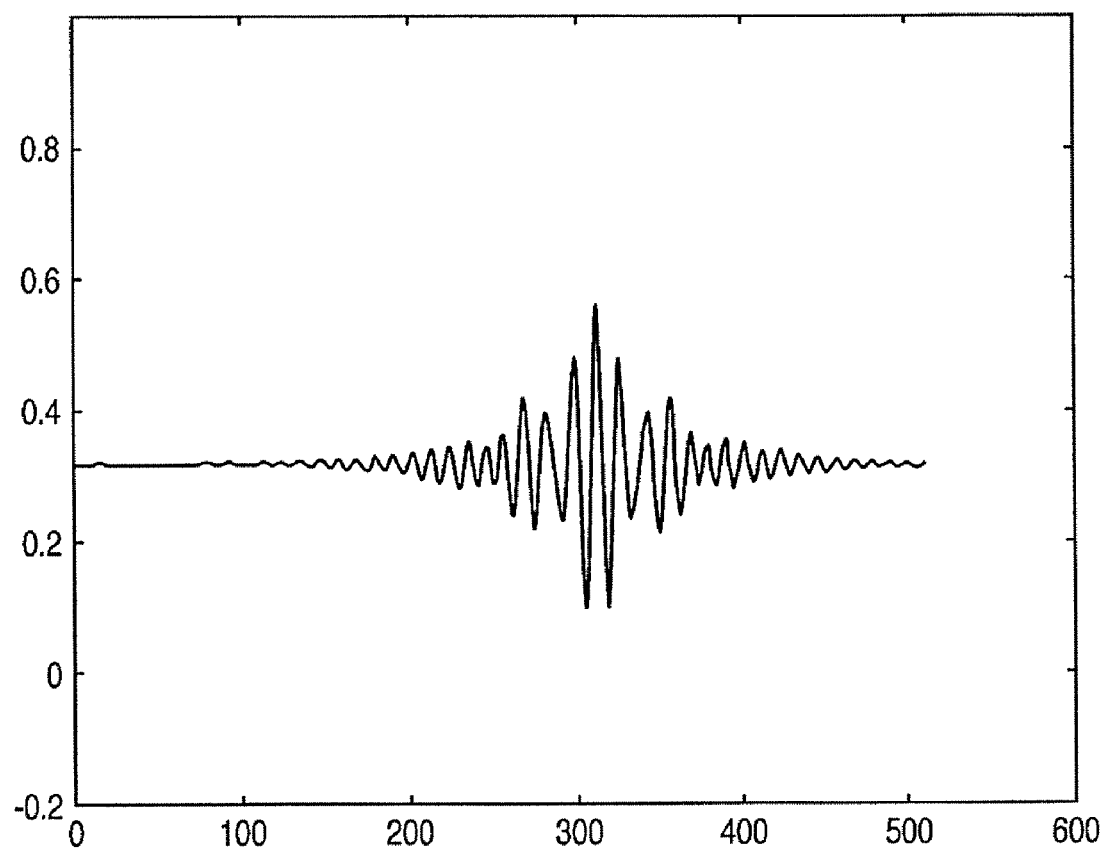
FIG. 20 shows an interference signal obtained by simulation under an oblique incidence condition.

FIG. 20 shows an interference signal obtained by simulation in the arrangement shown in FIG. 19. The broadband light used for this simulation had wavelengths from 400 nm to 700 nm (pitch: 10 nm), and an incident angle (θin) of 75°. The measurement target was a resist. The thickness of the resist was set at 20 μm or more so as to split light beams reflected by the lower surface of the resist. The reference surface was $SiO_2$. The pitch at which a piezoelectric element drives the reference mirror was 77.2 nm.

Figure 9:
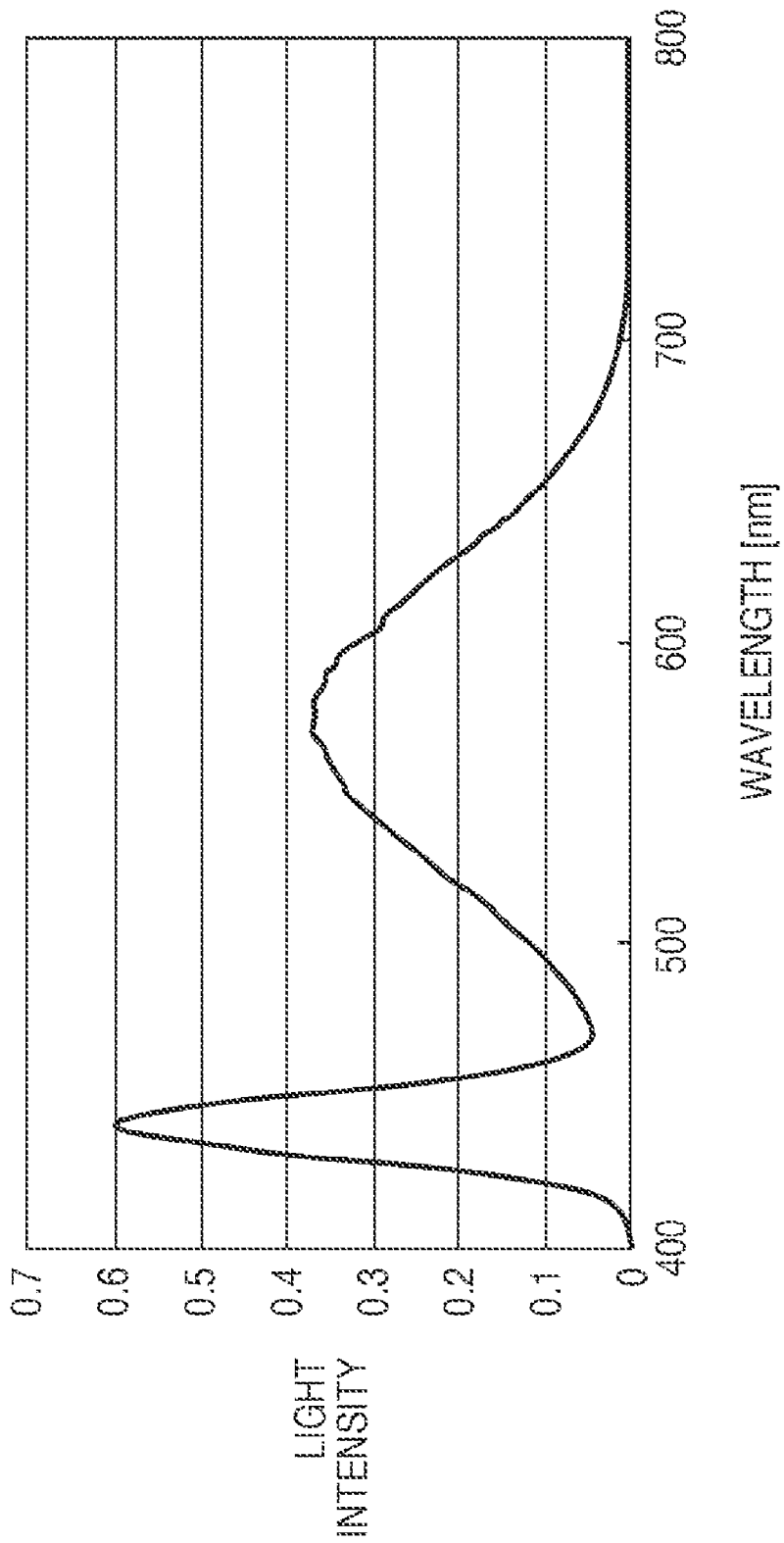
FIG. 9 illustrates the spectral distribution of a white LED.

The light source was a so-called white LED having the spectral distribution shown in FIG. 9.

Figure 24:
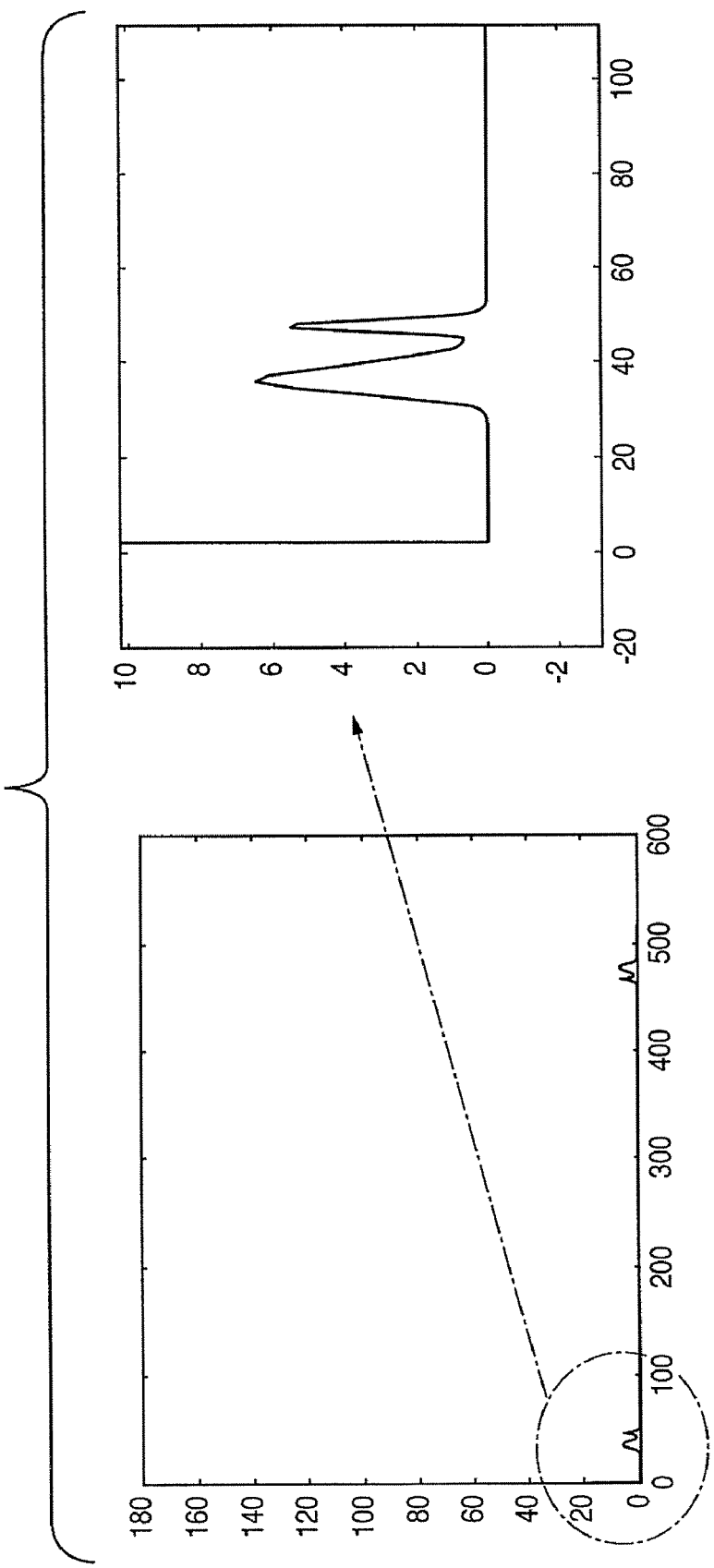
FIG. 24 shows an amplitude distribution obtained by Fourier-transforming the interference signal shown in FIG. 20.

FIG. 24 shows an amplitude distribution obtained by Fourier-transforming an interference signal generated by using this broadband light. The right side of FIG. 24 shows an enlarged view of its left side. FIG. 24 reveals that the shape of the amplitude distribution inverted with respect to that shown in FIG. 9 reflects the spectral distribution of the light source (the enlarged distribution portion shown in FIG. 24 is inverted with respect to the distribution shown in FIG. 9 because they are conjugate in frequency to each other).

Figure 21:
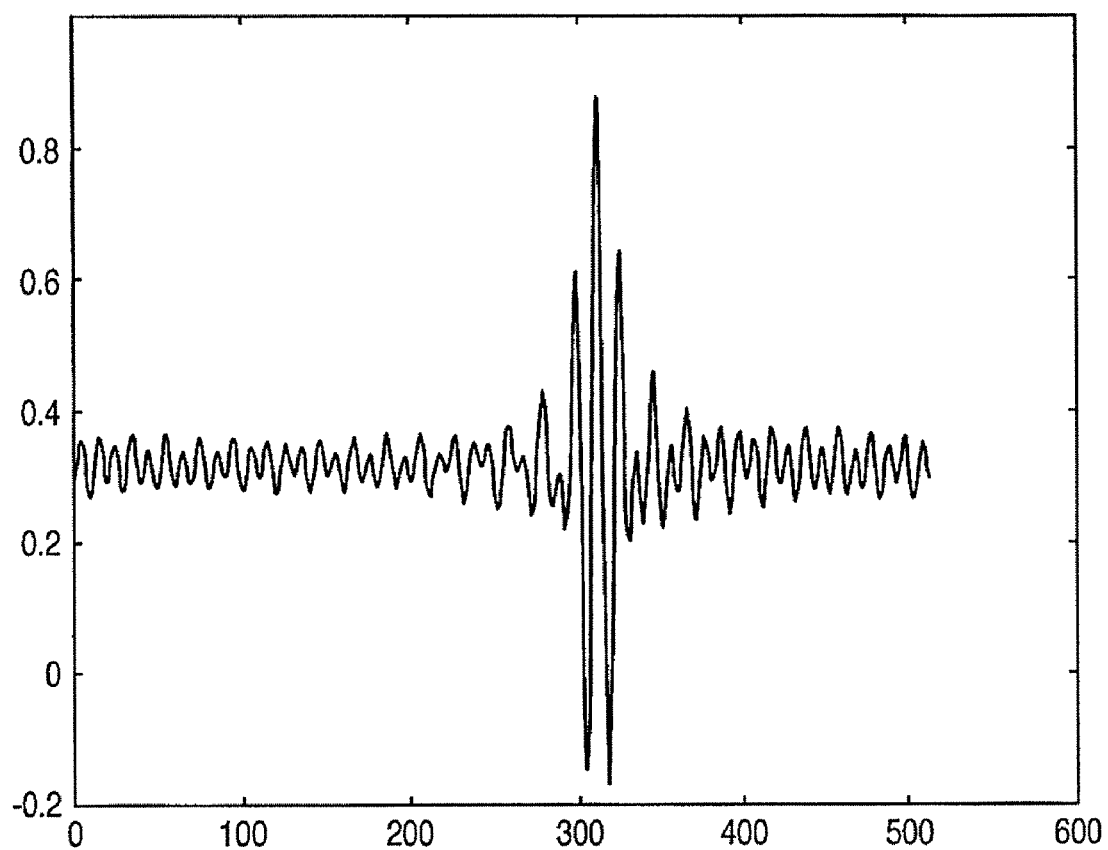
FIG. 21 shows an interference signal obtained by increasing the contrast of the interference signal shown in FIG. 20.
Figure 22:
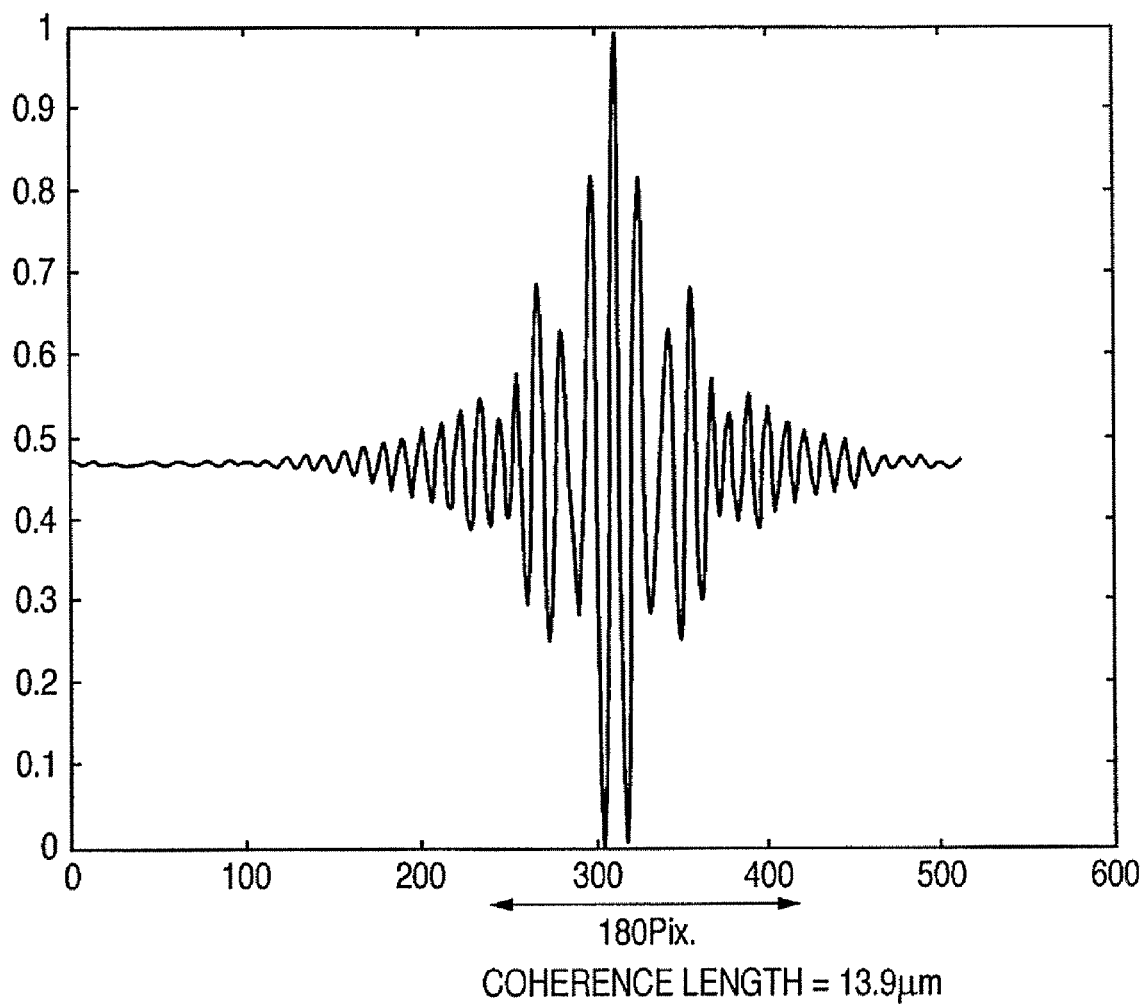
FIG. 22 shows a signal obtained by normalizing the signal shown in FIG. 20.
Figure 23:
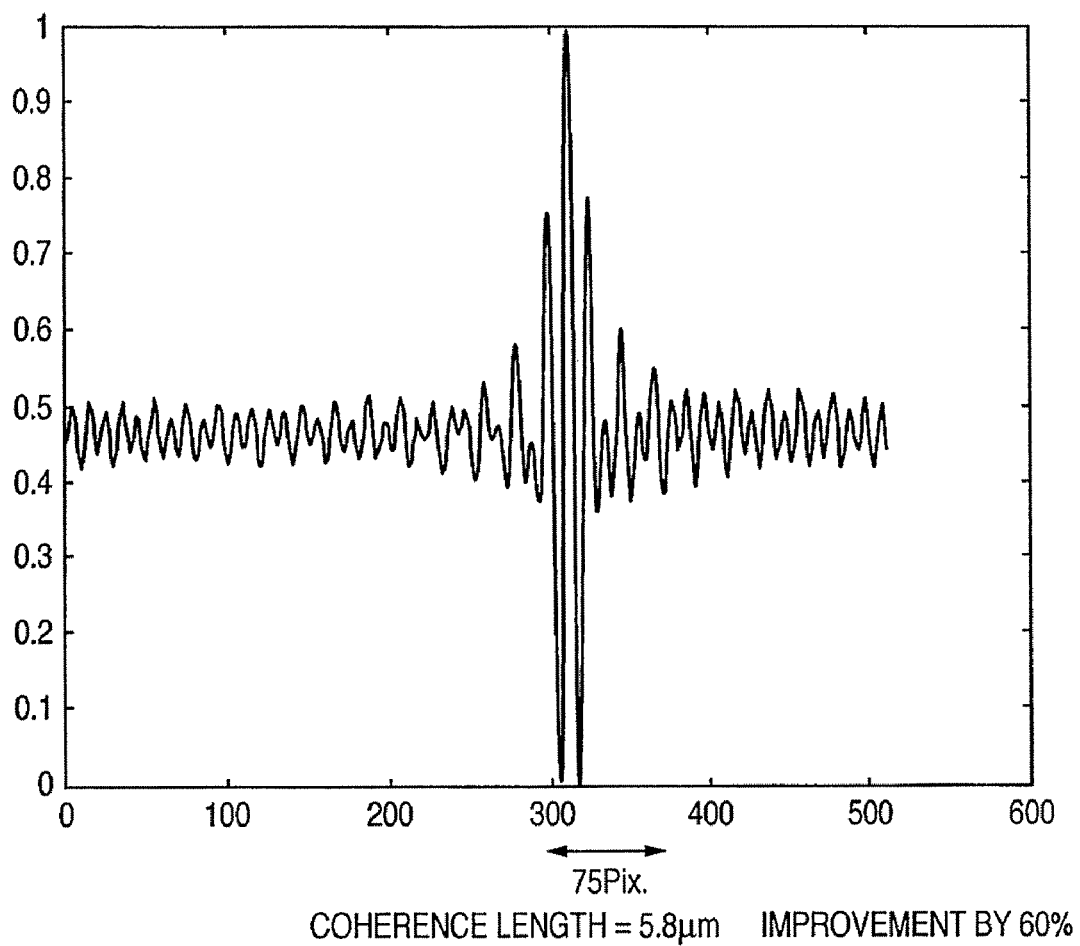
FIG. 23 shows a signal obtained by normalizing the signal shown in FIG. 21.
Figure 25:
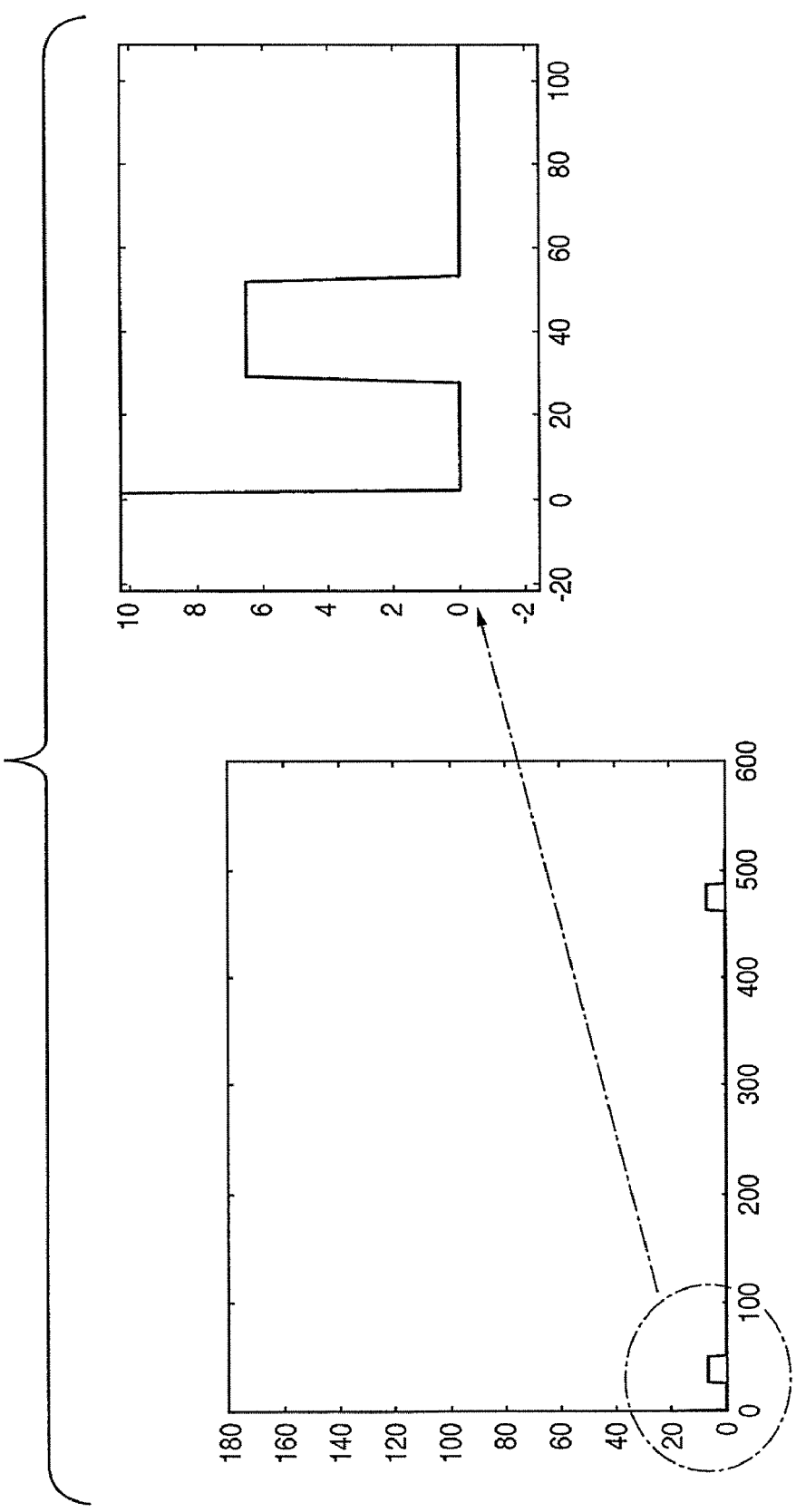
FIG. 25 illustrates a distribution function W.

FIG. 21 shows the result of inverse Fourier transformation using a distribution function W as illustrated in FIG. 25. FIGS. 22 and 23 show signals obtained by normalizing the signals shown in FIGS. 20 and 21, respectively, assuming that their maximum intensities are one. The coherence length is defined as the length, along the abscissa (vertical position), of the signal in a frequency region having amplitudes of 20% or more of that at the maximum intensity, in the same manner as above. In this case, the measured coherence lengths of the signals shown in FIGS. 22 and 23 are about 13.9 μm and 5.8 μm, respectively. That is, the coherence length of the signal shown in FIG. 23 is shortened to about 40% (5.8/13.9) of that shown in FIG. 22 by the application of the present invention.

Second Embodiment

Precise measurement is possible even when the present invention is applied to a case in which the measurement target surface has a plurality of reflection surfaces and is irradiated obliquely (e.g., a case in which an interference signal obtained by the arrangement according to the first embodiment is processed by a method described in "Example of Application to Lithography").

Assume that an amplitude distribution obtained by Fourier-transforming an interference signal using the above-described method is shaped in accordance with the distribution function W shown in FIG. 3. Even in this case, high detection precision may not be obtained depending on a vertical structure (stacked structure) formed by a plurality of transparent films (multilayer film). This is because a frequency at which the reflection phase (the phase of reflected light) is abnormal exists depending on the stacked structure. A frequency at which the reflection phase is abnormal will be explained below.

Figure 27:
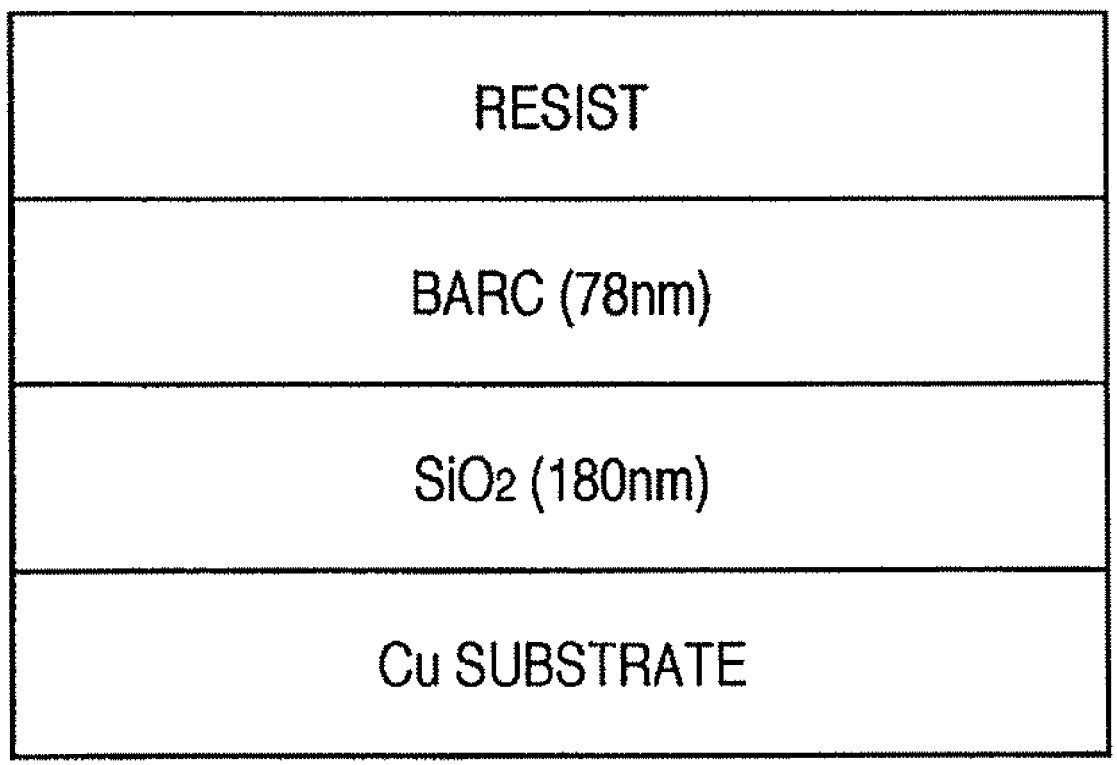
FIG. 27 shows an example of a stacked structure.
Figure 28:
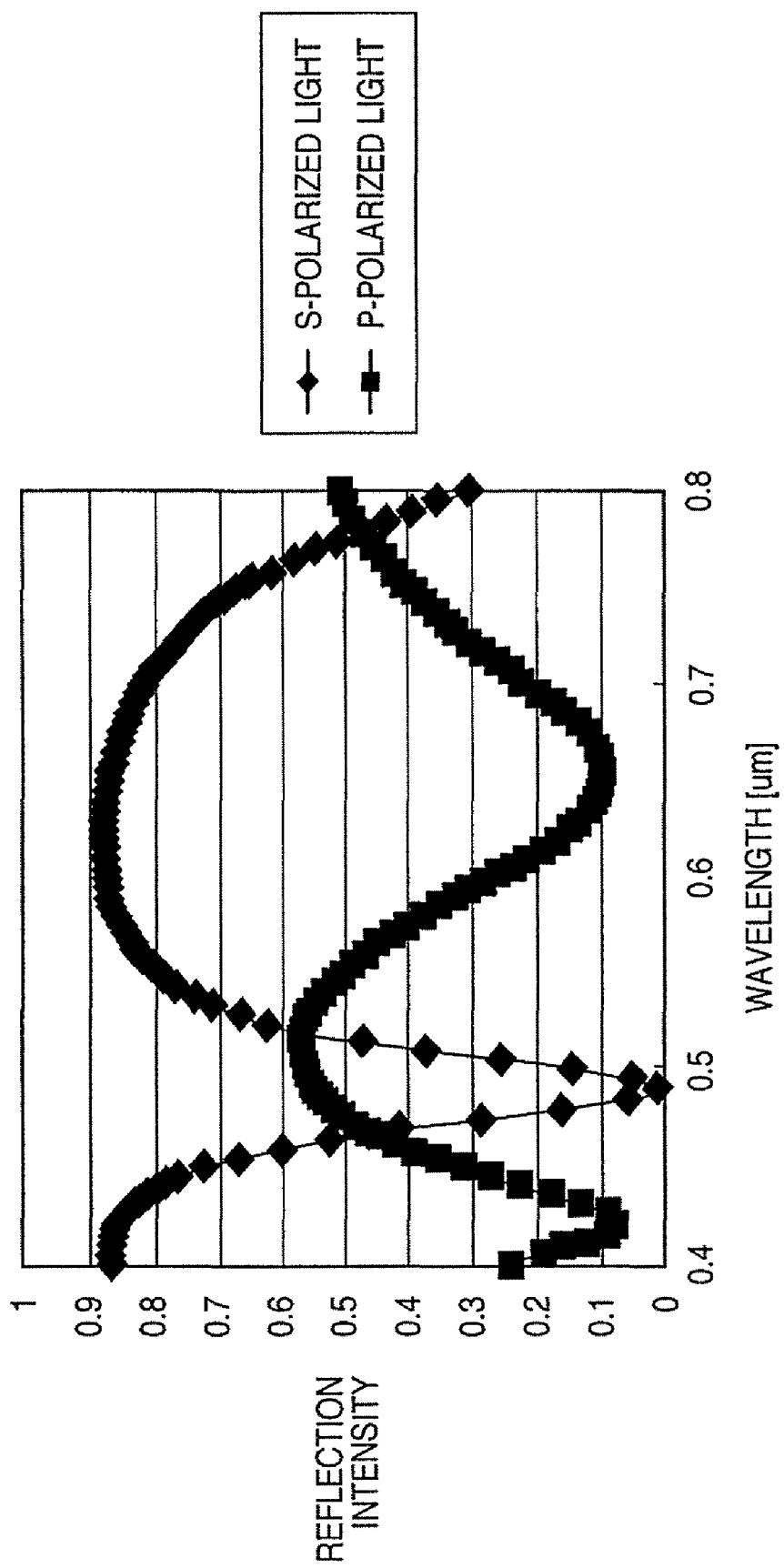
FIG. 28 shows the reflection intensities of S-polarized light and P-polarized light reflected by the stacked structure shown in FIG. 27.
Figure 29:
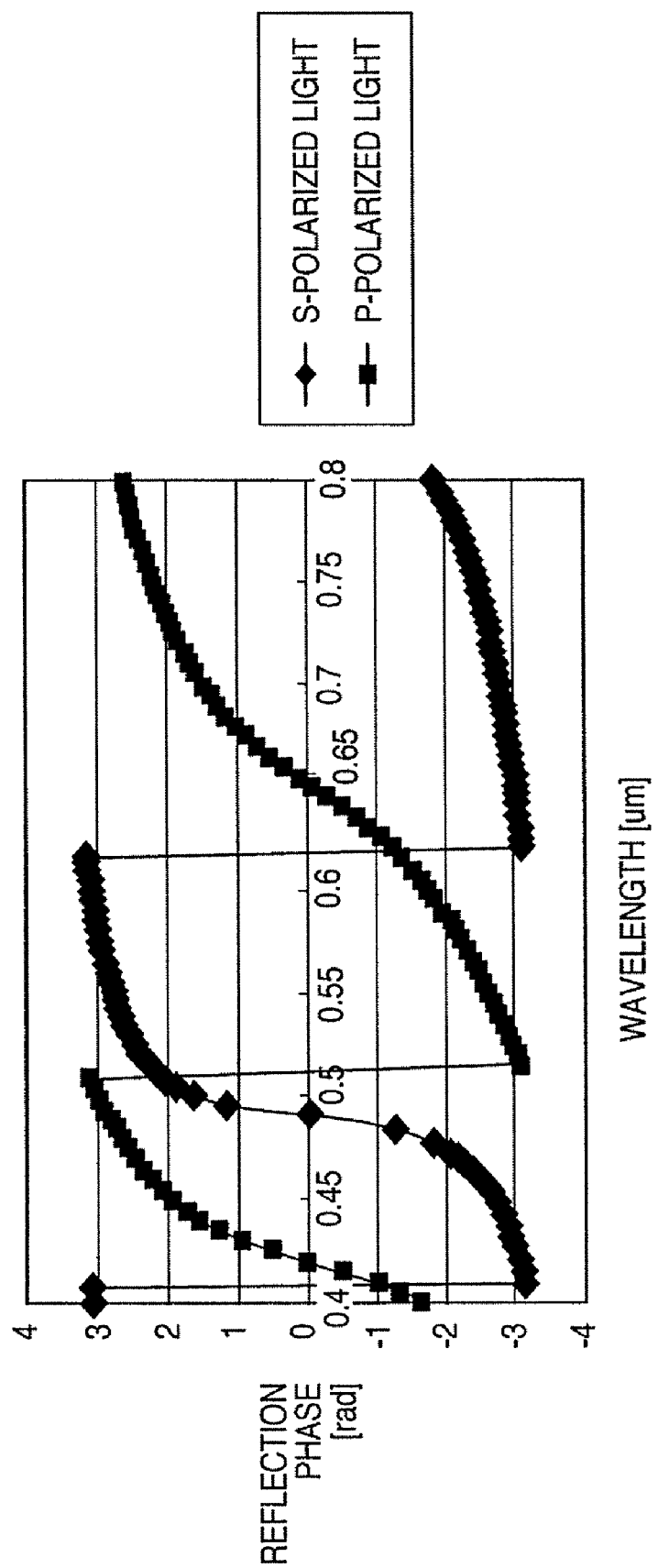
FIG. 29 shows the reflection phases of the S-polarized light and P-polarized light reflected by the stacked structure shown in FIG. 27.

FIG. 27 shows an example of a structure in which a 240-nm thick resist, 78-nm thick BARK, and 180-nm thick $SiO_2$ are stacked on a Cu substrate. The refractive indices of the resist, BARK, and $SiO_2$ are 1.54, 1.53, and 1.46, respectively. The real part and imaginary part of the refractive index of the Cu substrate are 0.38 and 2.9, respectively. FIGS. 28 and 29 show the reflection intensity and reflection phase, respectively, of S-polarized light and P-polarized light reflected by this stacked structure as a function of wavelength. Referring to FIG. 28, the ordinate indicates the reflection intensity (the reflectance is 100% when the reflection intensity is one), and the abscissa indicates the wavelength (μm). Referring to FIG. 29, the ordinate indicates the phase (radian), and the abscissa indicates the wavelength (μm). The wavelength range is set from 0.4 μm (400 nm) to 0.8 μm (800 nm) to exemplify a case below in which an interference signal is acquired using the interferometer shown in FIG. 19 and the white LED light source is in the wavelength range (400 nm to 800 nm) shown in FIG. 9.

In the example shown in FIG. 28, the reflection intensity of the S-polarized light rapidly decreases around a wavelength of 500 nm, while that of the P-polarized light rapidly decreases around a wavelength of 650 nm. On the other hand, in the example shown in FIG. 29, the reflection phase of the S-polarized light rapidly changes around a wavelength of 500 nm, while that of the P-polarized light rapidly changes around a wavelength of 650 nm. Since the phase of the S-polarized light around a wavelength of 600 nm is 3 radians to −3 radians, the reflection phase remains the same. In this manner, the reflection intensity rapidly decreases around a wavelength at which the reflection phase changes rapidly. Note that a wavelength at which the reflection intensity and reflection phase change rapidly is defined as an abnormal wavelength (abnormal frequency) at which the reflection phase is abnormal.

As described above, ideally, the phase of an interference signal, gradually changes as its wavelength changes, as can be understood from the principle of white light interference. However, the reflection phase of an interference signal from the stacked structure as shown in FIG. 27 rapidly changes at an abnormal wavelength (abnormal frequency) at which the reflection phase illustrated in FIGS. 28 and 29 is abnormal, resulting in a non-ideal interference signal. This is obvious even from the fact that a white light interference signal is the sum of interference signal components having a plurality of wavelengths (frequencies).

By executing the processing explained with reference to FIG. 1 for an interference signal containing a component having a frequency at which the reflection phase is abnormal, this component can be enhanced depending on the stacked structure. Consequently, an interference signal component corresponding to the upper surface of the resist is adversely affected, so high detection precision may not be obtained.

Third Embodiment

The third embodiment of the present invention will be explained in detail next. The feature of the third embodiment resides in amplitude distribution shaping step 130 explained with reference to FIG. 1. In the example explained with reference to FIG. 3, a frequency region in which the phase distribution has a good linearity is the shaping target. The amplitude in the frequency region as the shaping target is flattened.

FIG. 30 shows the sequence of shaping step 130 according to the third embodiment. In shaping step 130 according to the third embodiment, a frequency region in which the amplitude is greater than or equal to a predetermined value is determined as the shaping target in step 3010. In step 3020, a phase change is calculated from the phase distribution. In step 3030, abnormal frequency regions in which a phase change is abnormal in the shaping target frequency region are determined. In step 3040, the amplitude distribution is shaped in the shaping target frequency region such that the amplitudes in the abnormal frequency regions in which a phase change is determined to be abnormal become lower than those in the other frequency regions. A more detailed example of each of steps 3010 to 3040 will be explained below.

An abnormal frequency at which the reflection phase is abnormal is often contained at both ends of a region having spectral information. When the phase distribution is used, the shaping target frequency region may be erroneously determined. To avoid this situation, the shaping target frequency region is determined from the amplitude distribution in step 3010. A frequency region having amplitudes greater than or equal to the ratio of a reference amplitude to the maximum amplitude of the Fourier-transformed amplitude distribution can be determined as the shaping target. Alternatively, a frequency region having intensities higher than the median value of the spectral intensity in all the frequency regions of the Fourier-transformed amplitude distribution may be determined as the shaping target. Alternatively, a frequency region corresponding to the wavelength range of the light source may be determined as the shaping target.

Below is exemplified a case in which a frequency region determined as the shaping target has intensities higher than the median value of the spectral intensity in all the frequency regions of the Fourier-transformed amplitude distribution.

Figure 31:
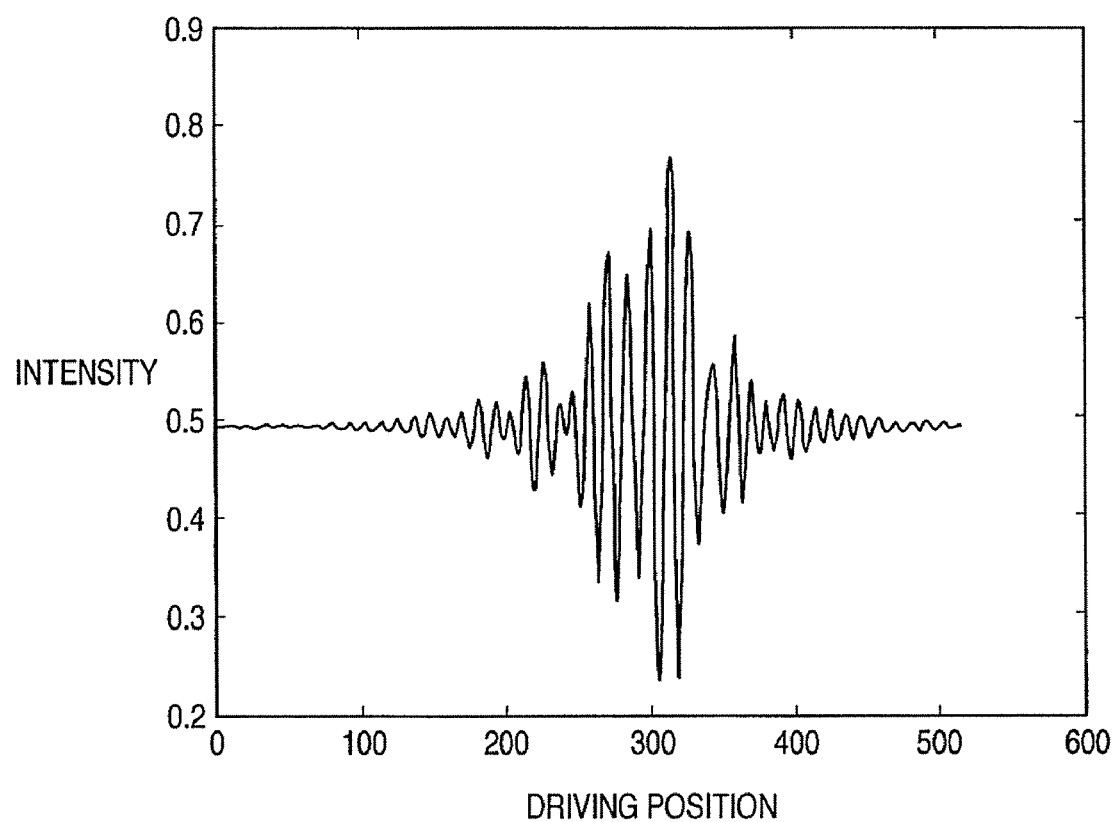
FIG. 31 shows an interference signal obtained by simulation in the arrangement shown in FIG. 19.

FIG. 31 shows an interference signal obtained by simulation in the arrangement shown in FIG. 19. The calculation condition was set such that the light source was a white LED light source (wavelength: 400 nm to 800 nm, pitch: 10 nm) shown in FIG. 9, and the incident angle (θin) was 75°. The measurement target was a resist having a 240-nm thick stacked structure shown in FIG. 27. The reference surface was $SiO_2$. The pitch at which a piezoelectric element drives a reference surface was 77.2 nm. The reference surface was driven in a direction in which it comes close to the measurement target. Referring to FIG. 31, the abscissa indicates the piezoelectric element driving position, the interval between adjacent positions is 77.2 nm, and the total number of positions is 512. The ordinate indicates the intensity of the interference signal. The number of positions at each of which the light path lengths of light beams reflected by the reference surface and the upper surface of the resist match was 312.

Figure 32:
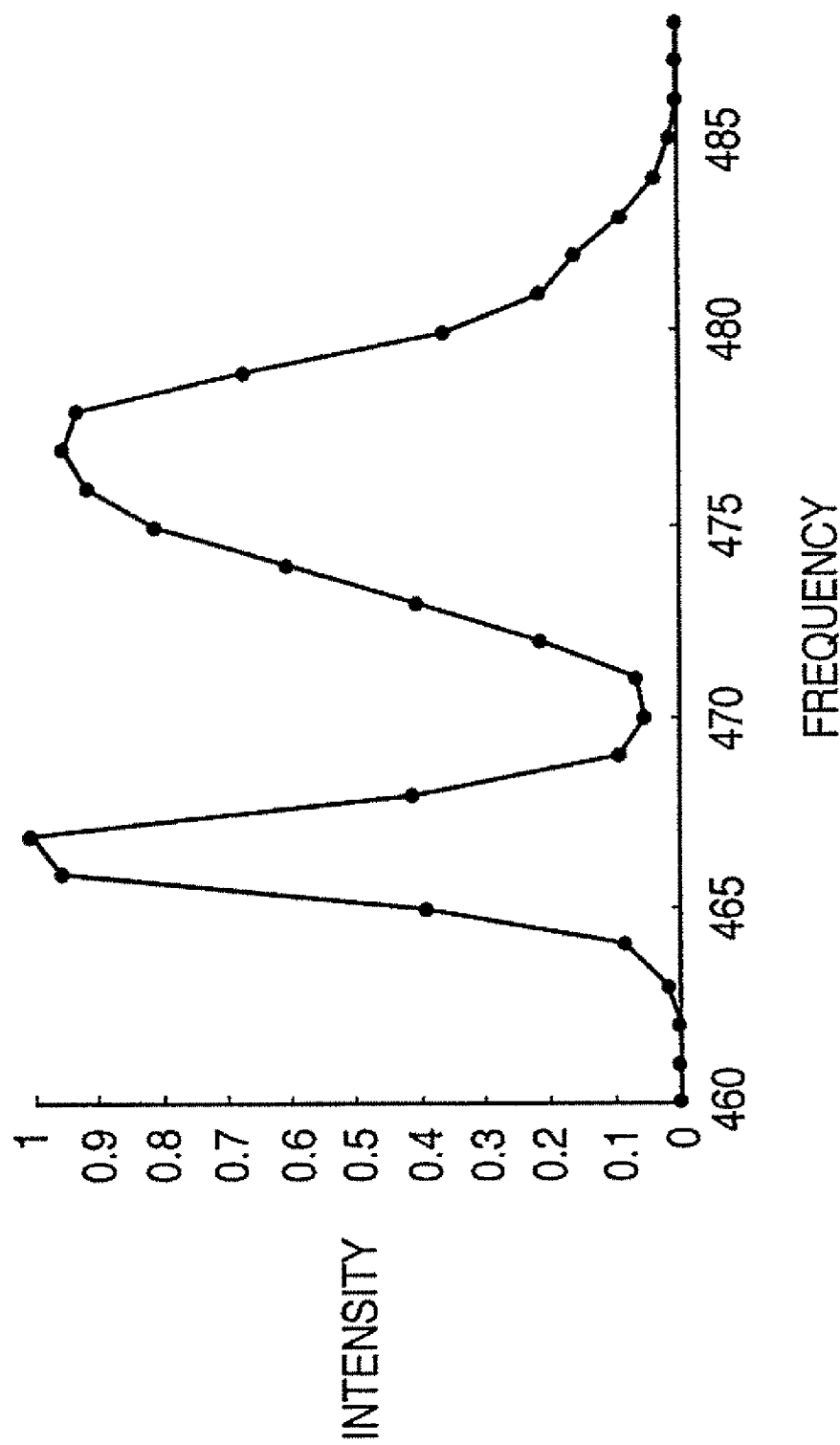
FIG. 32 shows the result of normalizing an amplitude distribution obtained by Fourier-transforming the interference signal shown in FIG. 31.
Figure 33:
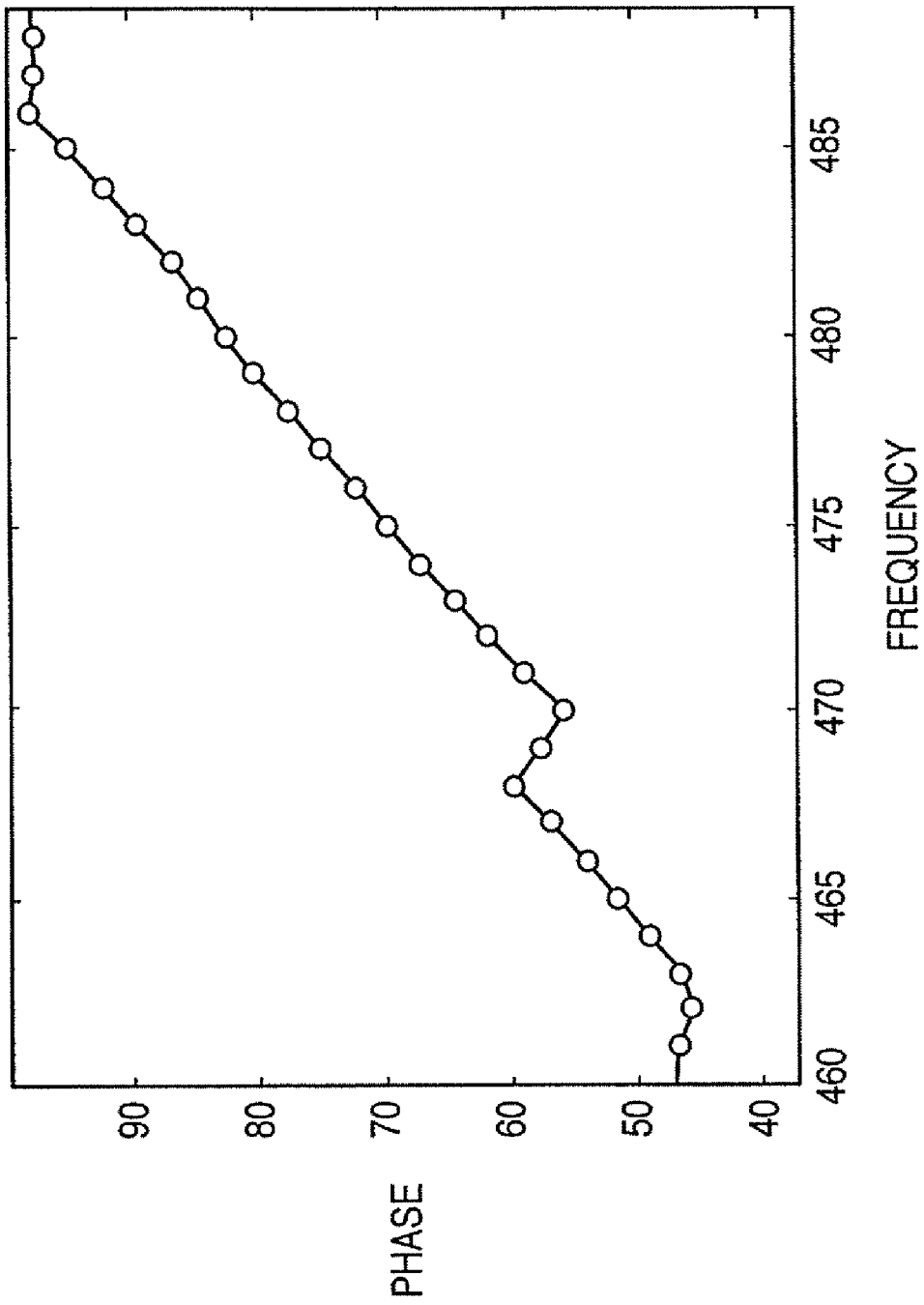
FIG. 33 shows a phase distribution obtained by Fourier-transforming the interference signal shown in FIG. 31.

FIGS. 32 and 33 show the result of Fourier-transforming the interference signal shown in FIG. 31. FIG. 32 corresponds to the enlarged view (an enlarged view of a Fourier-transformed amplitude distribution) shown in FIG. 24 referred to in the first embodiment. The interference signal is normalized assuming that the maximum amplitude of the amplitude distribution is one. The ordinate indicates the spectral intensity after normalization, and the abscissa indicates the frequency. Since the median value of the spectral intensity after normalizing all the frequency regions is 0.1, a frequency region in which the spectral value after normalization is 0.1 or more is determined as the shaping target. In this interference signal, a frequency region from 460 to 488 and a frequency region conjugate to it are determined as the shaping targets.

All the frequency regions do not correspond to the entire wavelength spectrum of the light source, but include frequency regions (other than direct current components) in which the frequency is equal to or lower than a cutoff frequency determined by the interference signal shown in FIG. 31.

Step 3020 will be explained in detail next.

FIG. 33 shows a Fourier-transformed phase distribution in the shaping target frequency region (from 460 to 488) determined in step 3010. The ordinate indicates the phase (radian), and the abscissa indicates the frequency.

Figure 34:
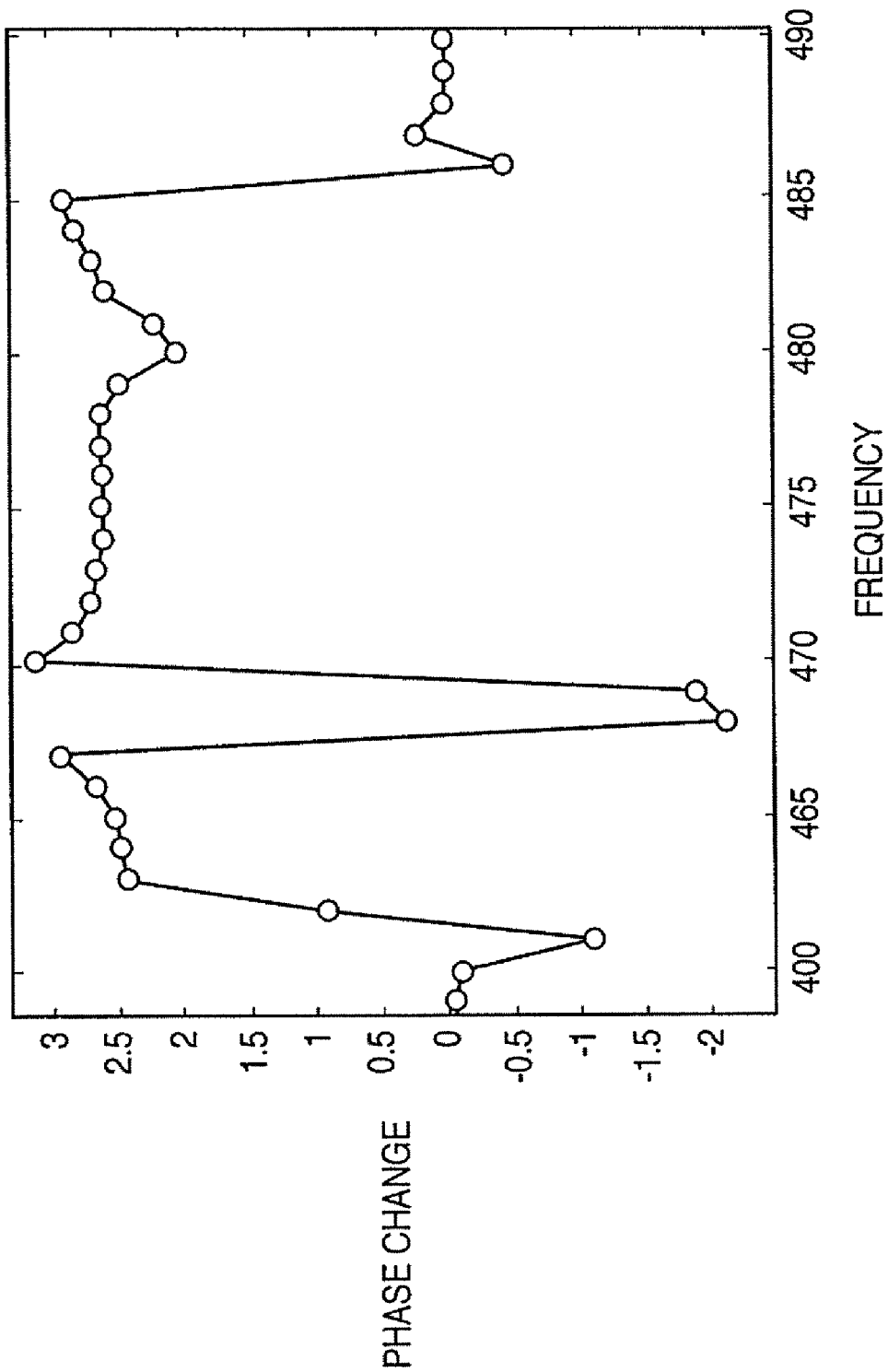
FIG. 34 shows a change in the phase shown in FIG. 33.

Using the phase distribution, a phase change (the slope of the phase distribution) is calculated for adjacent frequencies in the shaping target frequency region (from 460 to 488). FIG. 34 illustrates the calculation result.

In step 3030, the median value of the phase change (the slope of the phase distribution) calculated in step 3020 is calculated in the shaping target frequency region (from 460 to 488). In this example, the median value is 2.7 radians. A frequency at which the absolute value of the difference in phase change from the median value is greater than or equal to a predetermined amount is determined as an abnormal frequency. An optimal predetermined amount is calculated for a stacked structure in advance on the basis of an interference signal obtained by simulation using an interferometer having the arrangement shown in FIG. 19.

The predetermined amount can be, for example, a value 0.1 times (inclusive) to 3.0 times (inclusive) the standard deviation.

Figure 44A:
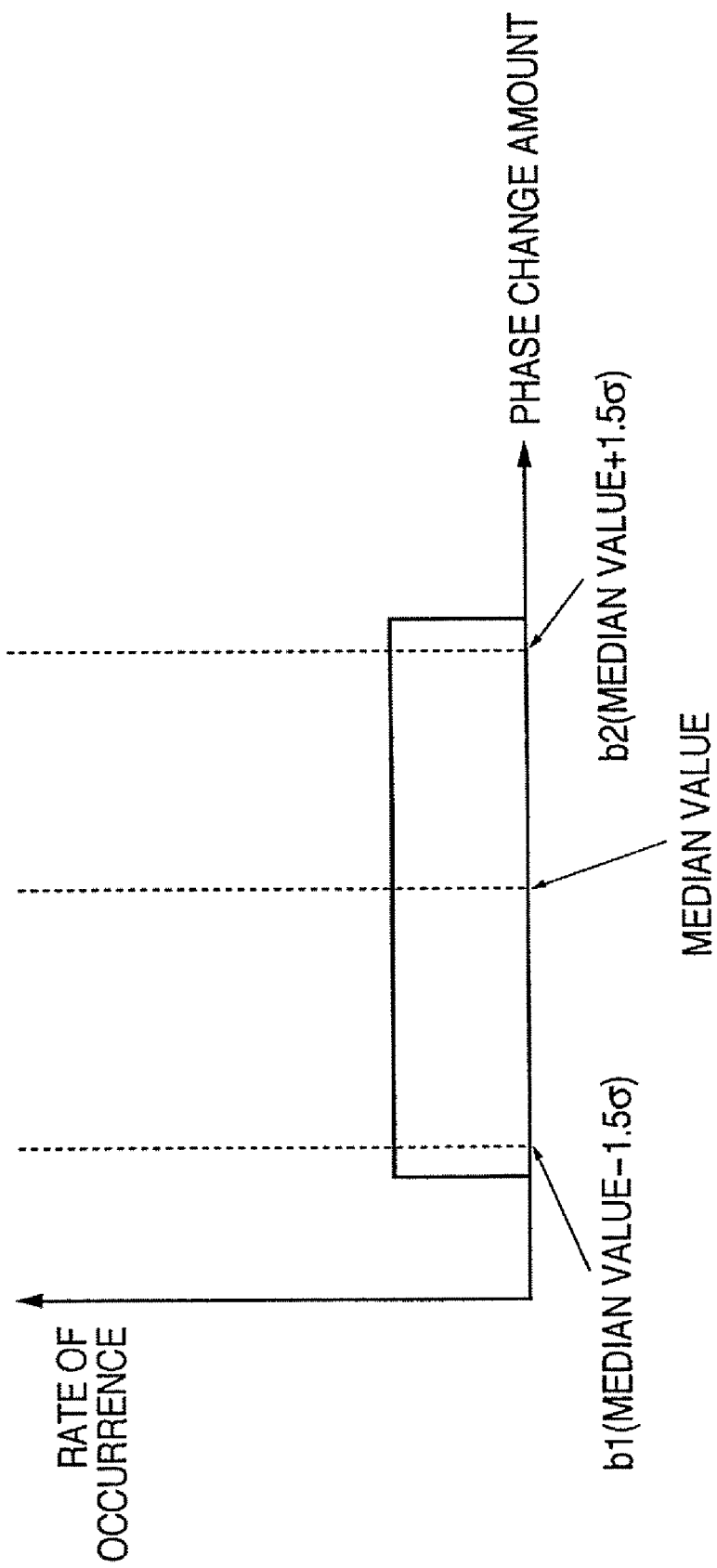
FIG. 44A illustrates a rate of occurrence distribution of the phase change amount.
Figure 44B:
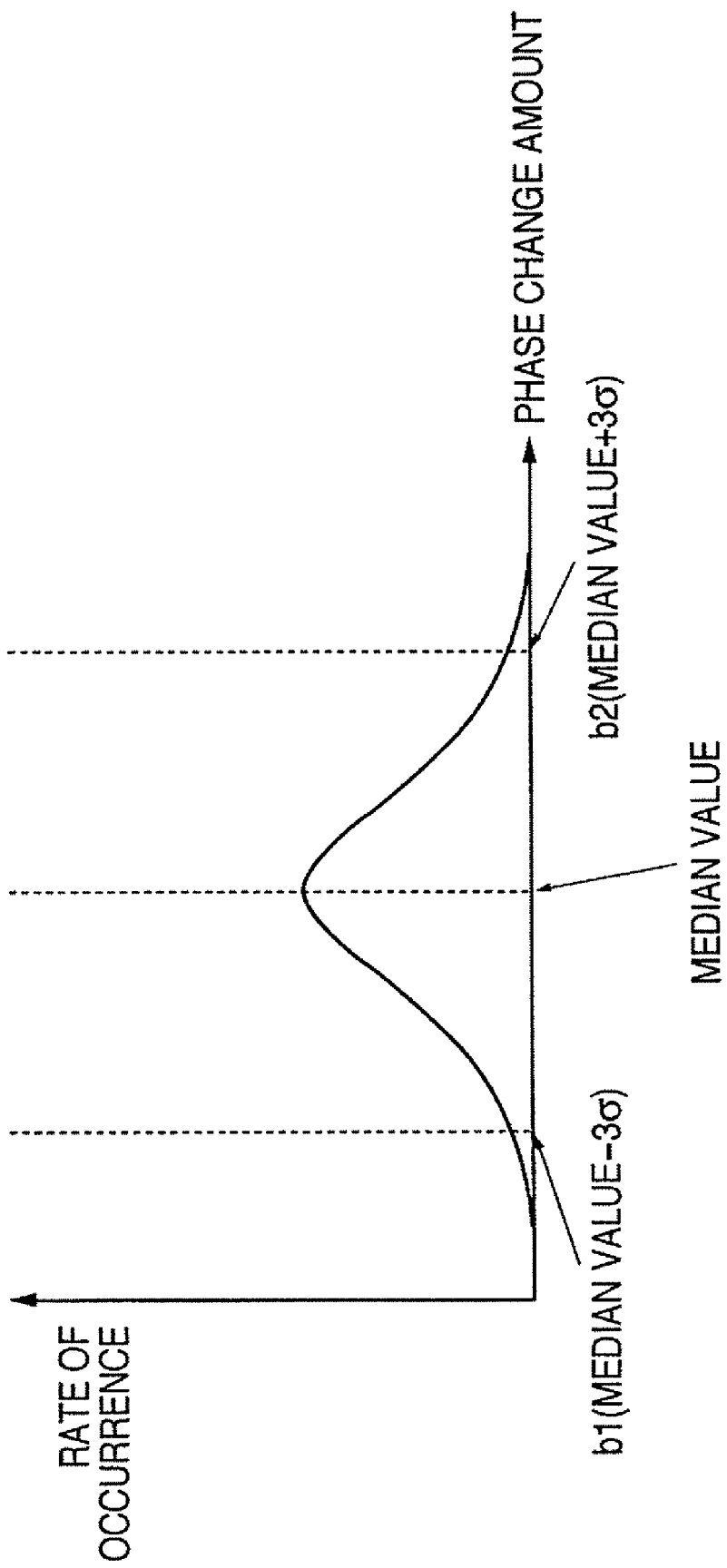
FIG. 44B illustrates another rate of occurrence distribution of the phase change amount.
Figure 44C:
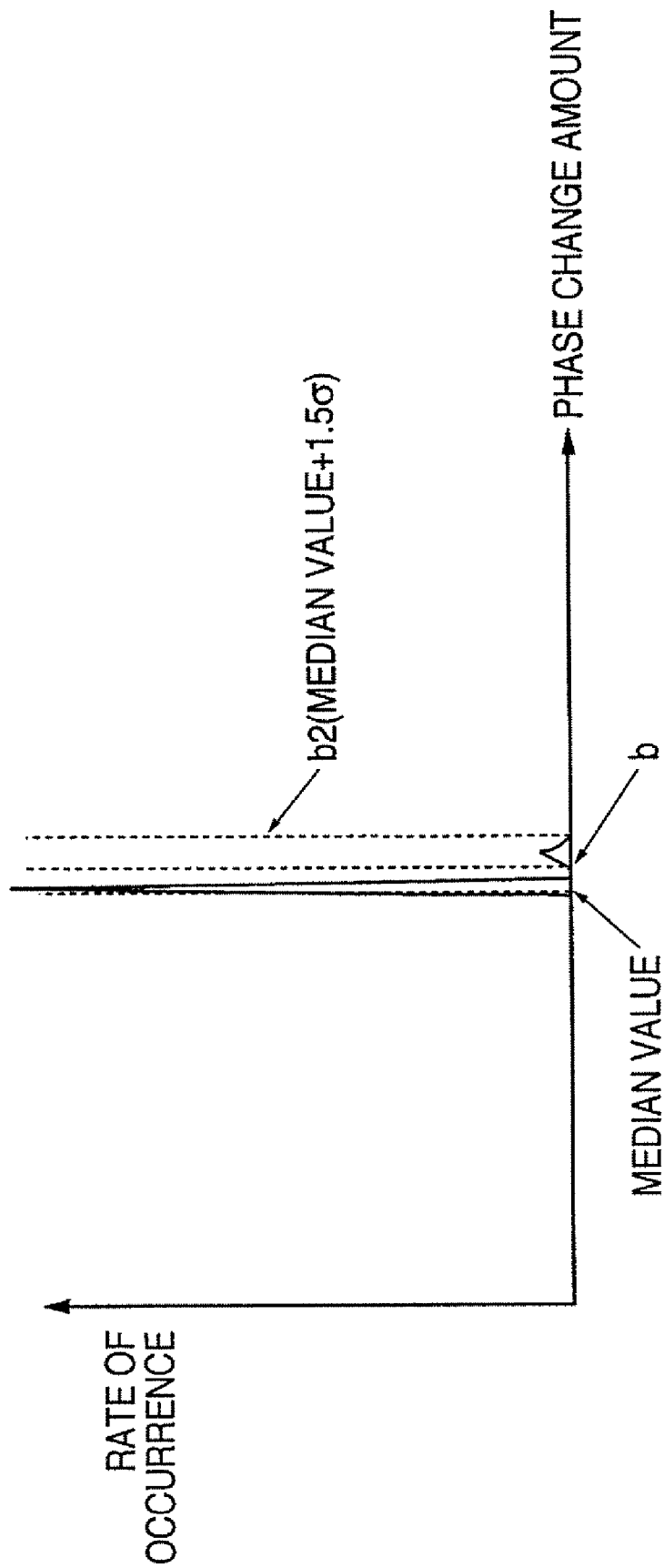
FIG. 44C illustrates still another rate of occurrence distribution of the phase change amount.

The rate of occurrence distribution of the phase change amount can be a uniform distribution as shown in FIG. 44A, a normal distribution as shown in FIG. 44B, or a bipolar distribution as shown in FIG. 44C. Referring to FIGS. 44A to 44C, the abscissa indicates the phase change amount, and the ordinate indicates its rate of occurrence. If the rate of occurrence distribution is a uniform distribution as shown in FIG. 44A, a phase change amount which differs from the median value by, for example, 1.5 times or more σ (σ: standard deviation) can be regarded as an outlier. In the example shown in FIG. 44A, a phase change amount of b1 or less or b2 or more is an outlier. If the rate of occurrence distribution is a normal distribution as shown in FIG. 44B, a phase change amount which differs from the median value by, for example, 3.0 times σ (σ: standard deviation) or more can be regarded as an outlier. In the example shown in FIG. 44B, a phase change amount of b1 or less or b2 or more is an outlier. A frequency corresponding to the phase change amount regarded as an outlier is determined as an abnormal frequency.

FIG. 44C exemplifies a case in which a frequency corresponding to a phase change amount of b or more is an abnormal frequency. The value b is greater than or equal to the median value and is less than or equal to b2, which is the sum of the median value and 1.5 times σ (σ: standard deviation). If the rate of occurrence distribution is a bipolar distribution, a phase change amount which differs from the median value by n times σ (σ: standard deviation) or more cannot be determined as an outlier, unlike the above-described normal distribution and uniform distribution. This is because the outlier b of the phase change amount changes as individual measurement targets generate different interference signals. In this distribution, a phase change amount which differs from the median value by n times σ (σ: standard deviation) or more is regarded as an outlier. More specifically, the value n can be 0.1 (inclusive) to 3.0 (inclusive) according to an experiment. Also according to the experiment, a value n at which a best measurement precision is attained is 0.3.

When the measurement target has a stacked structure as shown in FIG. 27, the predetermined amount can be 0.5 radians, which is 0.3 times the standard deviation of the phase change amount in the shaping target frequency region (from 460 to 488). In accordance with this predetermined amount, phase change amounts from 2.2 to 3.2 radians are determined to be normal; amounts outside this range are determined to be abnormal. Consequently, frequencies from 460 to 462, from 468 to 469, from 480 to 481, and from 486 to 488 in the shaping target frequency region (from 460 to 488) are determined as abnormal frequencies.

Figure 35:
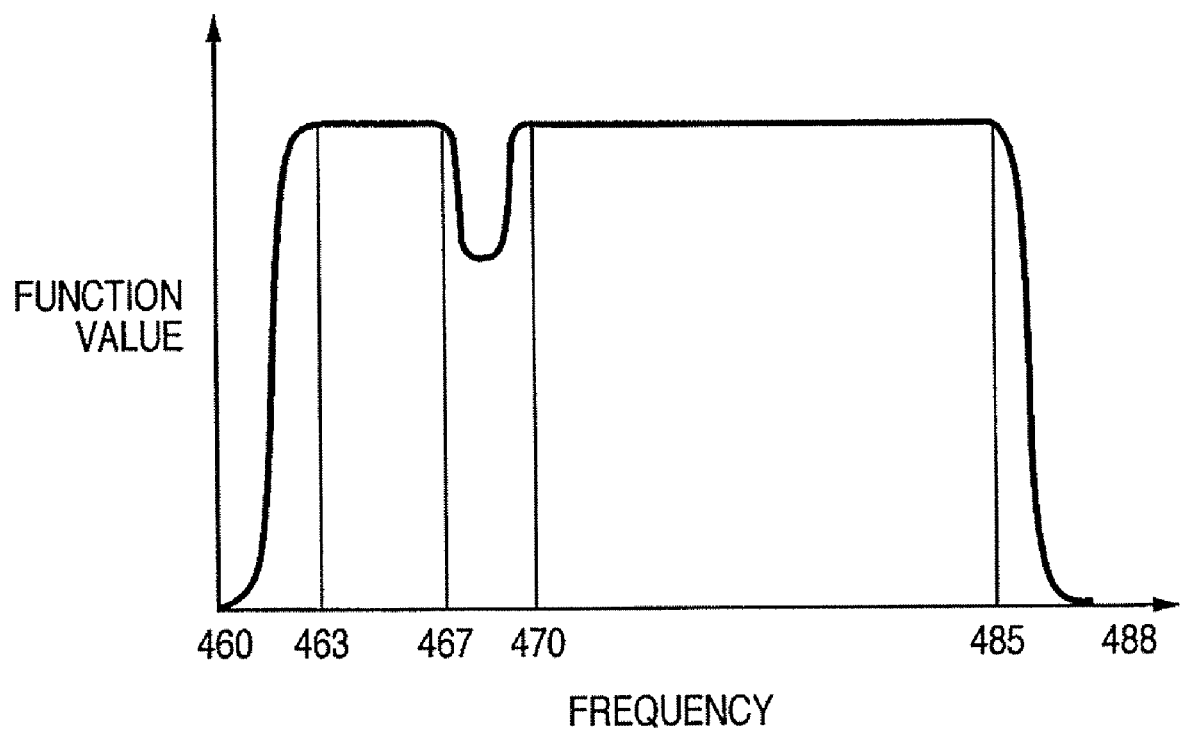
FIG. 35 shows a distribution function W according to the third embodiment.
Figure 36:
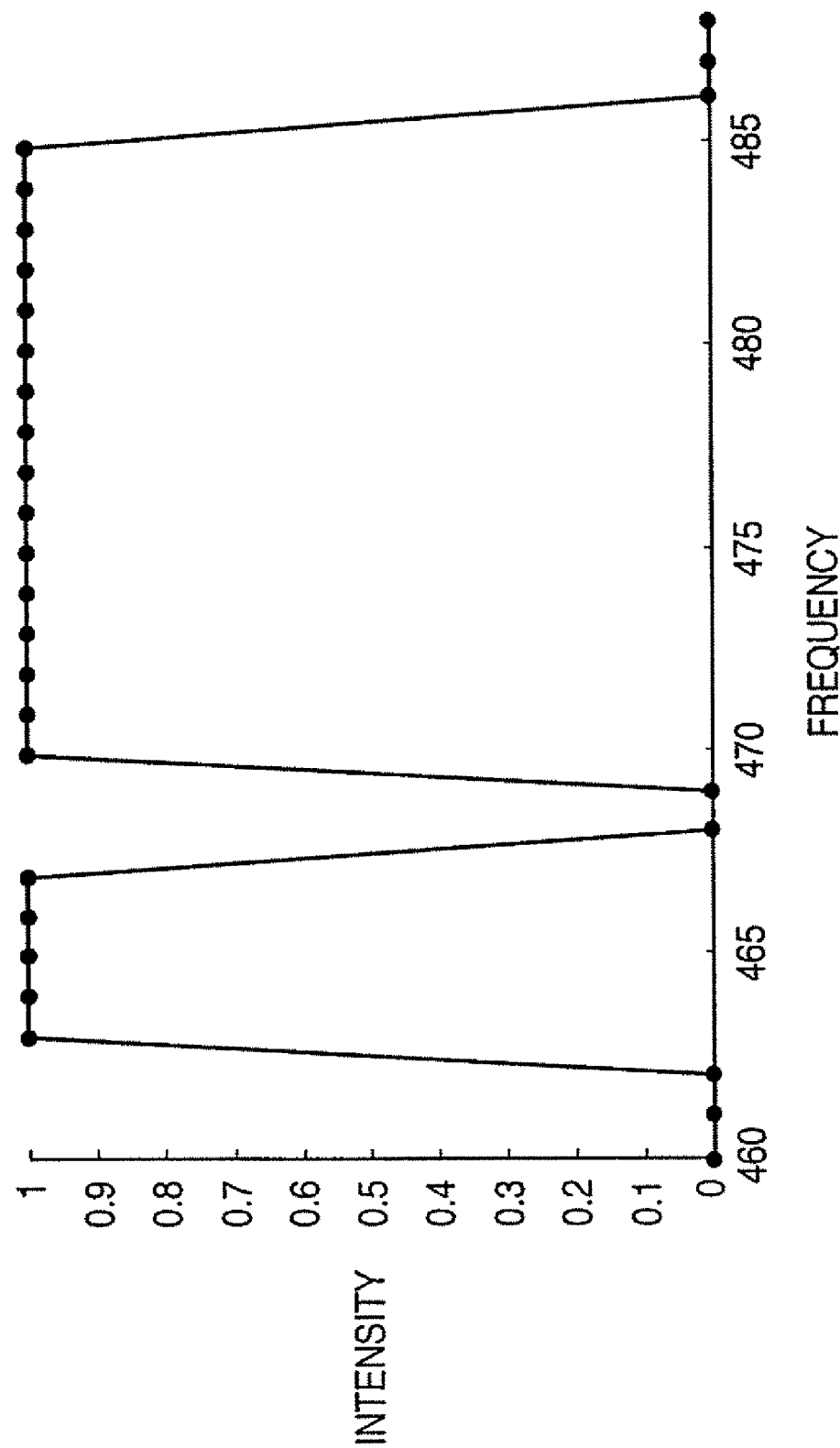
FIG. 36 shows the result of shaping the amplitude distribution in a shaping target frequency region such that the amplitudes in abnormal frequency regions become zero and the amplitudes in the other frequency regions become one according to the third embodiment.
Figure 37:
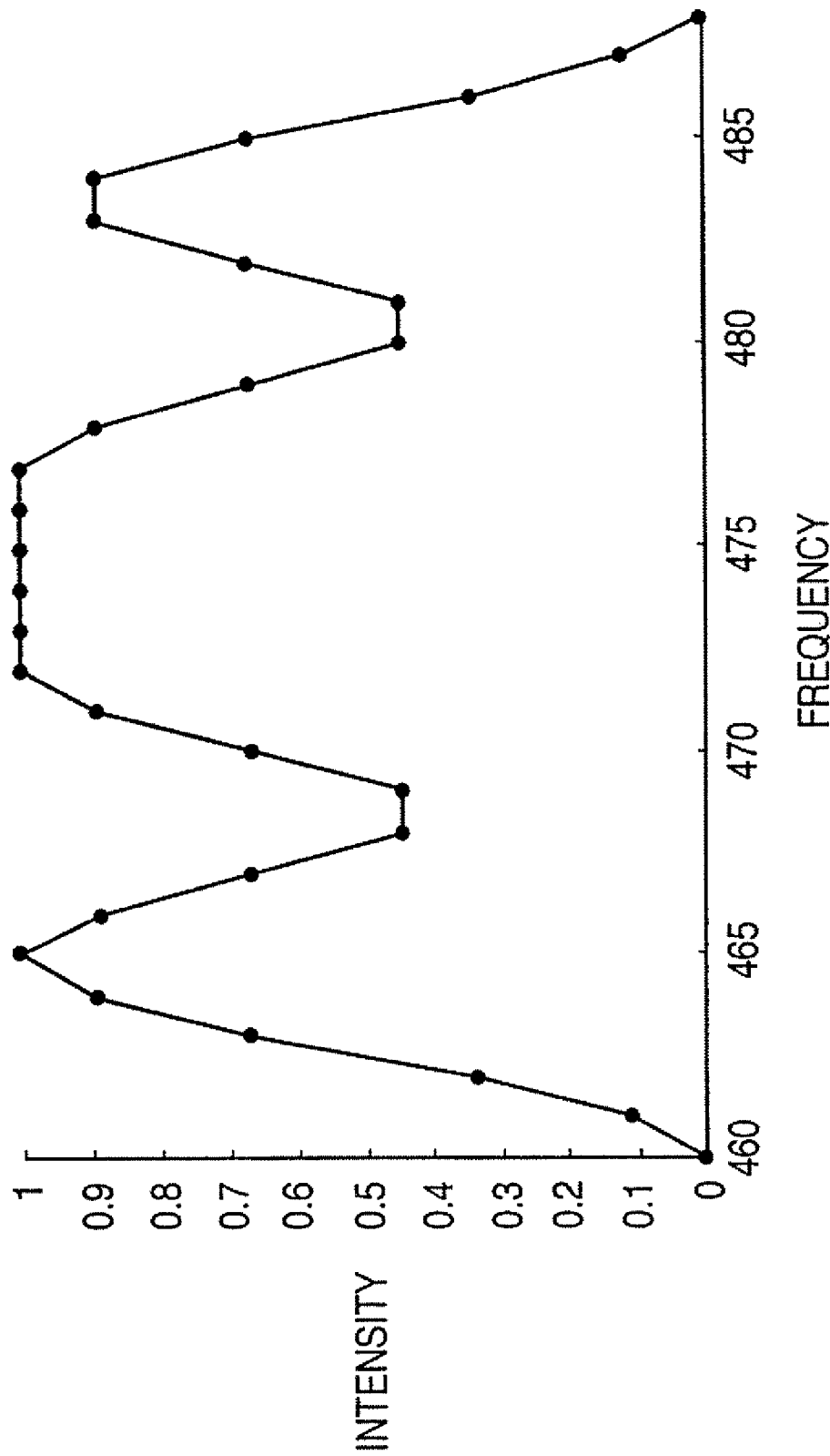
FIG. 37 shows the result of calculating the moving average of the amplitude distribution shown in FIG. 36 according to the third embodiment.

Lastly, in step 3040, the amplitudes in the abnormal frequency regions determined in step 3030 are set lower than those in the other frequency regions (normal frequency regions) in the shaping target frequency region (from 460 to 488). A frequency region conjugate to the frequency region (from 460 to 488) is shaped in the same way. For example, the amplitude distribution is shaped in accordance with a distribution function W shown in FIG. 35 so as to prevent both ends of the flat portion from exhibiting differential discontinuity, as described above. Alternatively, the amplitude distribution may be flattened so that the amplitudes in abnormal frequency regions become zero and those in the other frequency regions become equal to each other. In this embodiment, frequency regions from 460 to 462, from 468 to 469, from 480 to 481, and from 486 to 488 are determined as abnormal frequency regions, and the amplitudes in the abnormal frequency regions are set to zero and those in the other frequency regions are set to one. FIG. 36 shows the shaped amplitude distribution. The moving averaging of this amplitude distribution for a window width of 3 allows obtaining a shaped final amplitude distribution. FIG. 37 shows the final shaped amplitude distribution. The same operation is executed for the conjugate frequency region.

Figure 38:
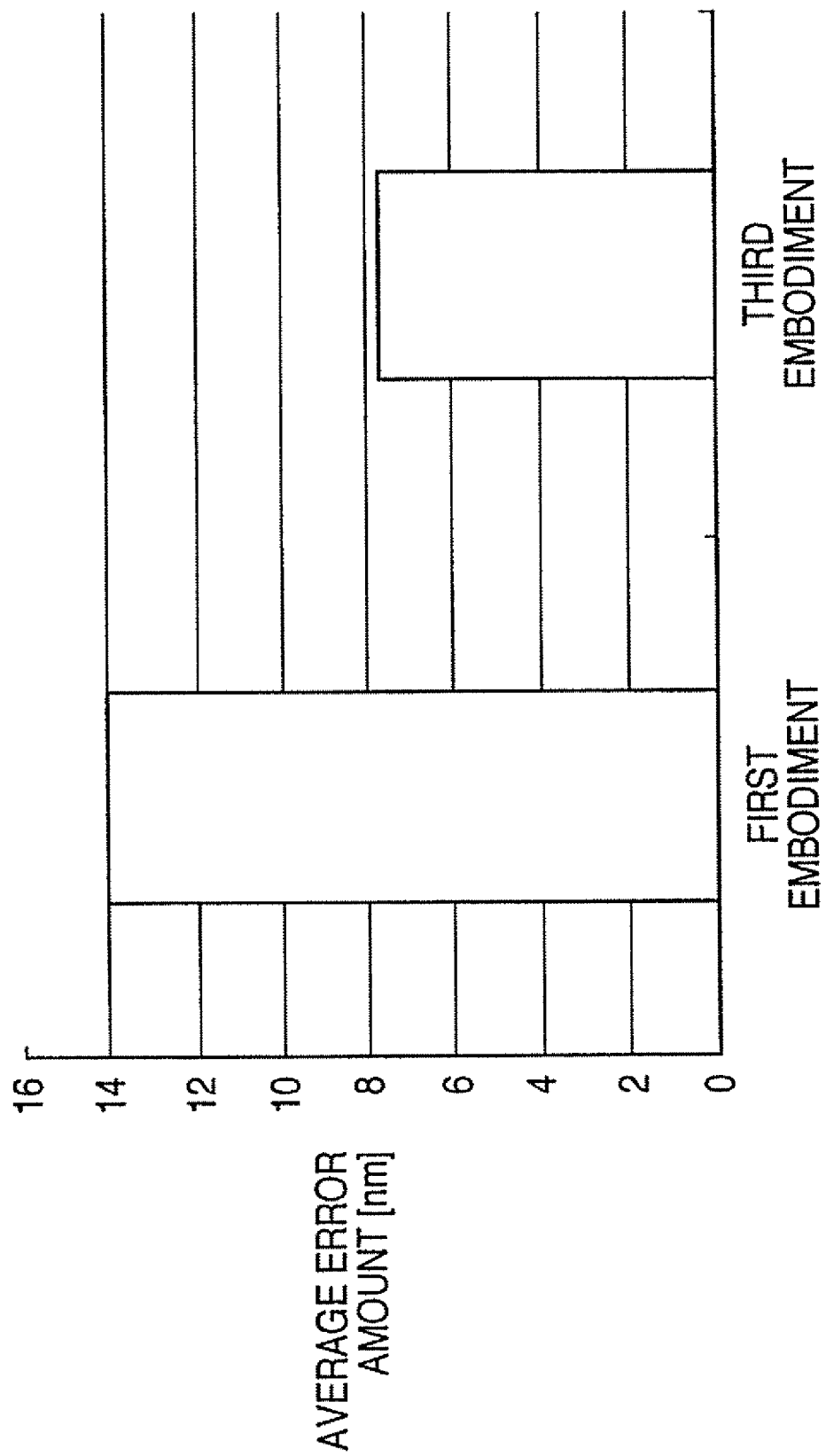
FIG. 38 shows the average error amounts (nm) in the first and third embodiments when the resist thickness changes from 100 nm to 300 nm at a pitch of 20 nm in the stacked structure shown in FIG. 27.

A case in which the resist thickness is 240 nm has been exemplified above. FIG. 38 shows the average error amounts (nm) of the resist surface positions, which are calculated according to the first and third embodiments for the interference signals obtained by simulation while changing the resist thickness from 100 nm to 300 nm at a pitch of 20 nm. The ordinate indicates the average error amount (nm). The average error amount in the first embodiment is 14 nm, whereas that in the third embodiment is slightly smaller than 8 nm, which is an improvement by 45%.

As has been described above, according to the third embodiment, it is possible to improve the detection precision by suppressing the amplitudes in abnormal frequency regions as compared with those in normal frequency regions.

Fourth Embodiment

The fourth embodiment of the present invention will be explained in detail next. The third embodiment uses the phase distribution to determine abnormal frequency regions. On the other hand, the fourth embodiment determines abnormal frequency regions based on the amplitude distribution. As described with reference to FIGS. 28 and 29, a frequency region in which the reflection phase changes rapidly has a correlation with a rapid decrease in reflection intensity. For this reason, the fourth embodiment uses the amplitude distribution instead of using the phase distribution.

Figure 39:
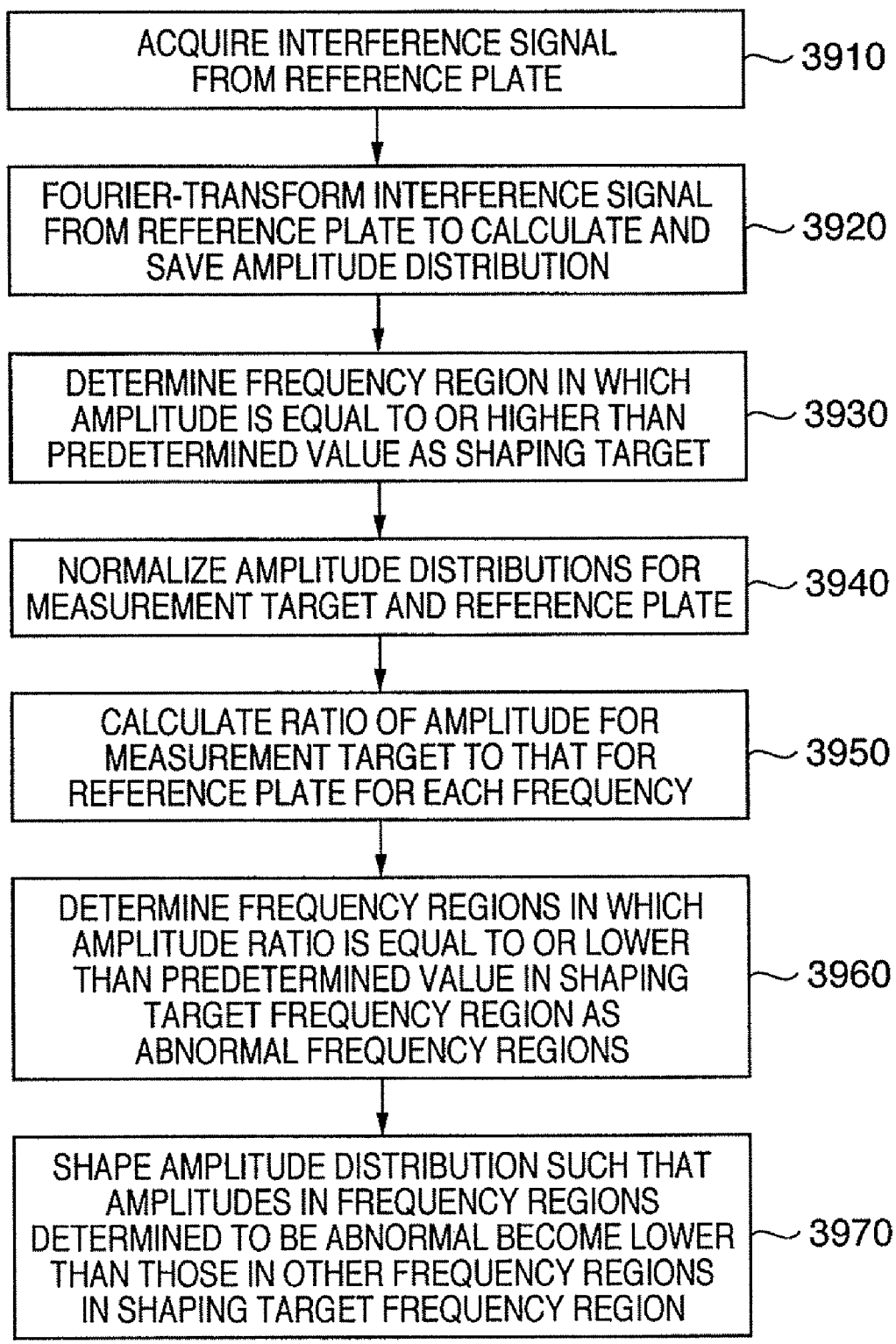
FIG. 39 shows an amplitude distribution shaping sequence according to the fourth embodiment.

FIG. 39 shows a sequence according to the fourth embodiment. In the fourth embodiment, an interference signal from a measurement target is acquired before the sequence shown in FIG. 39 (step 110 in FIG. 1), and it is Fourier-transformed (step 120 in FIG. 1). After that, the sequence shown in FIG. 39 is executed. First, in step 3910, an interference signal from a reference plate (e.g., an optical flat or SiO$_2$ plate) which is not formed by a transparent film is acquired by the same interferometer as used in step 110 of FIG. 1. In step 3920, an interference signal from the reference plate is Fourier-transformed to calculate an amplitude distribution, and data indicating it is saved. After that, in step 3930, a frequency region in which the amplitude is equal to or higher than a predetermined value in this amplitude distribution is determined as the shaping target frequency region.

In step 3940, the amplitude distribution for the measurement target and that for the reference plate are normalized. In step 3950, the ratio of the amplitude of the amplitude distribution obtained by Fourier-transforming the interference signal from the measurement target to that of the amplitude distribution obtained by Fourier-transforming the interference signal from the reference plate is calculated. In step 3960, frequency regions in which the amplitude ratio is equal to or lower than a predetermined value in the shaping target frequency region are determined as abnormal frequency regions. Lastly, in step 3970, the frequency distribution in the shaping target frequency region is shaped such that the amplitudes in the abnormal frequency regions become lower than those in the other frequency regions.

The reference plate used in step 3910 must be the one in which the frequency characteristic is flat with respect to the reflection intensity, and the reflection phase does not change rapidly.

Figure 40:
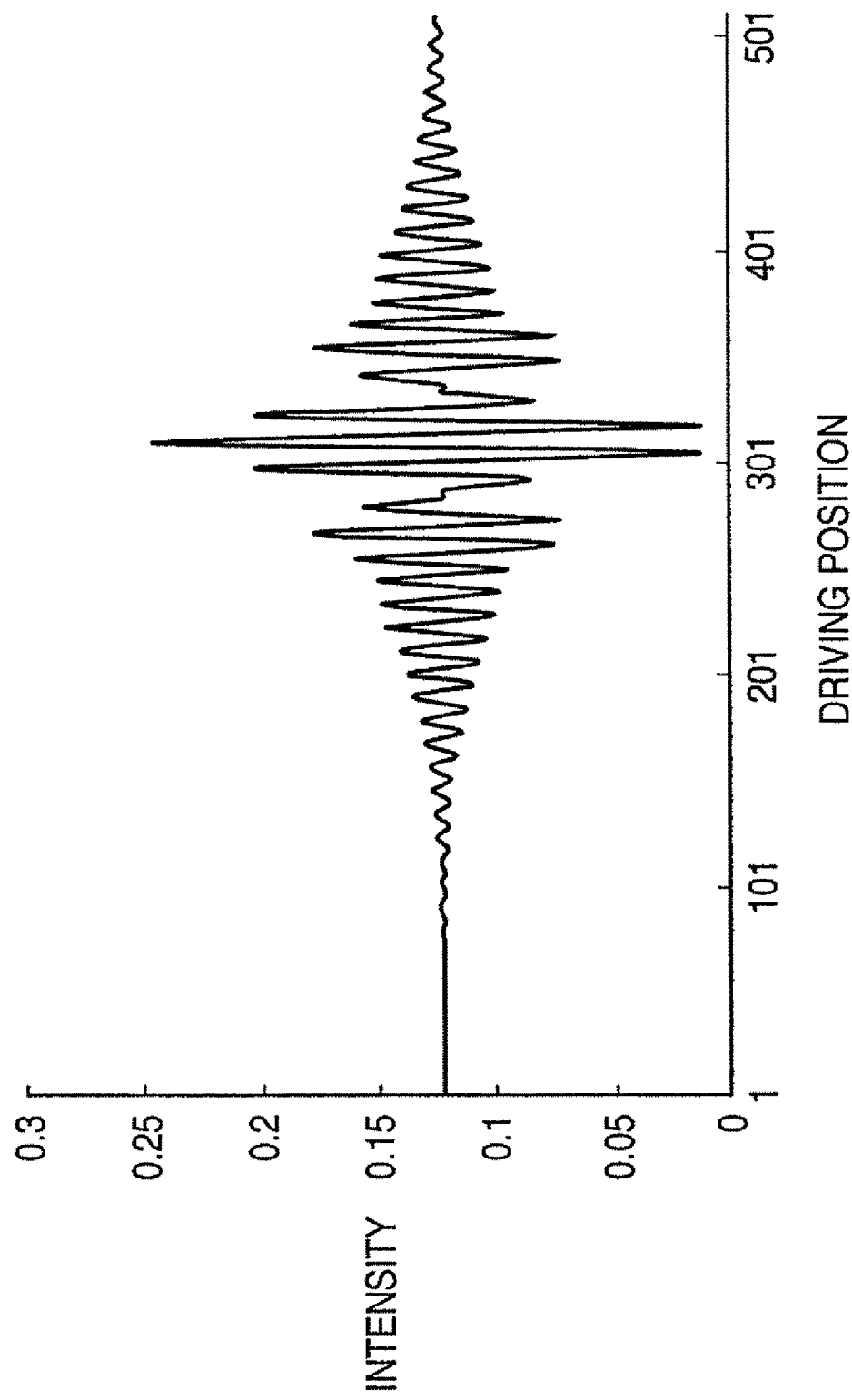
FIG. 40 shows an interference signal from an $SiO_2$ reference plate obtained by simulation in the arrangement shown in FIG. 19.

A more detailed example of each step will be explained below. In step 3910, the reference plate is an SiO$_2$ plate. FIG. 40 shows an interference signal obtained by simulation using the same interferometer as that used in step 110 of FIG. 1. The SiO$_2$ plate has a thickness (e.g., several millimeters) large enough to prevent light beams reflected by its lower surface from interfering with each other, a refractive index of 1.46, and a total of 512 points.

Figure 41:
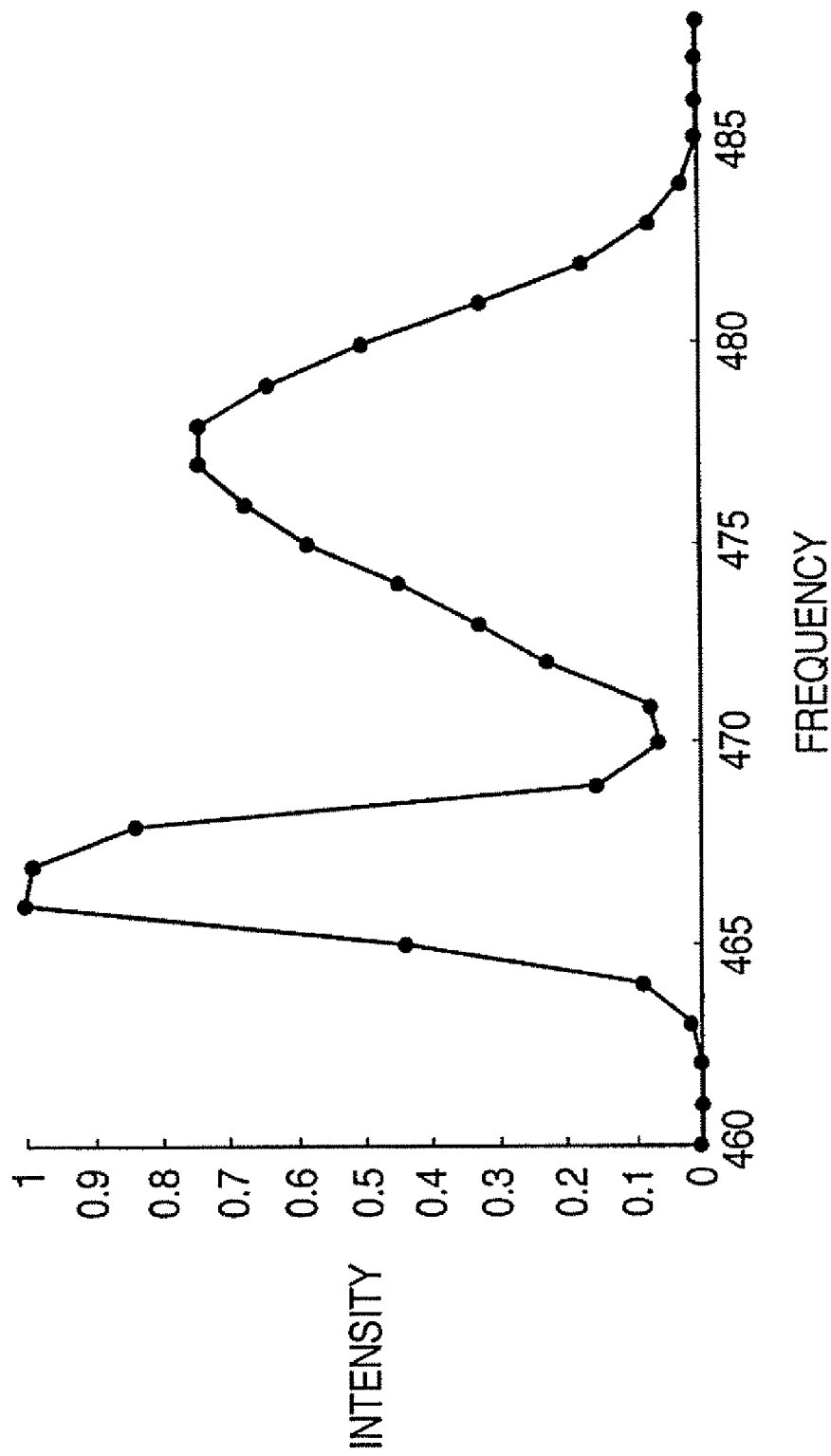
FIG. 41 shows the result of normalizing an amplitude distribution obtained by Fourier-transforming the interference signal from the $SiO_2$ reference plate shown in FIG. 40.

In step 3920, the interference signal acquired in step 3910 is Fourier-transformed to calculate an amplitude distribution, and data indicating it is saved. FIG. 41 shows the result of normalizing an amplitude distribution obtained by Fourier-transforming an interference signal from the SiO$_2$ reference plate shown in FIG. 40.

In step 3930, in the interference signal (FIG. 31) from the measurement target according to the third embodiment, a frequency region from 460 to 488 and a frequency region conjugate to it are determined as the shaping targets.

Figure 42:
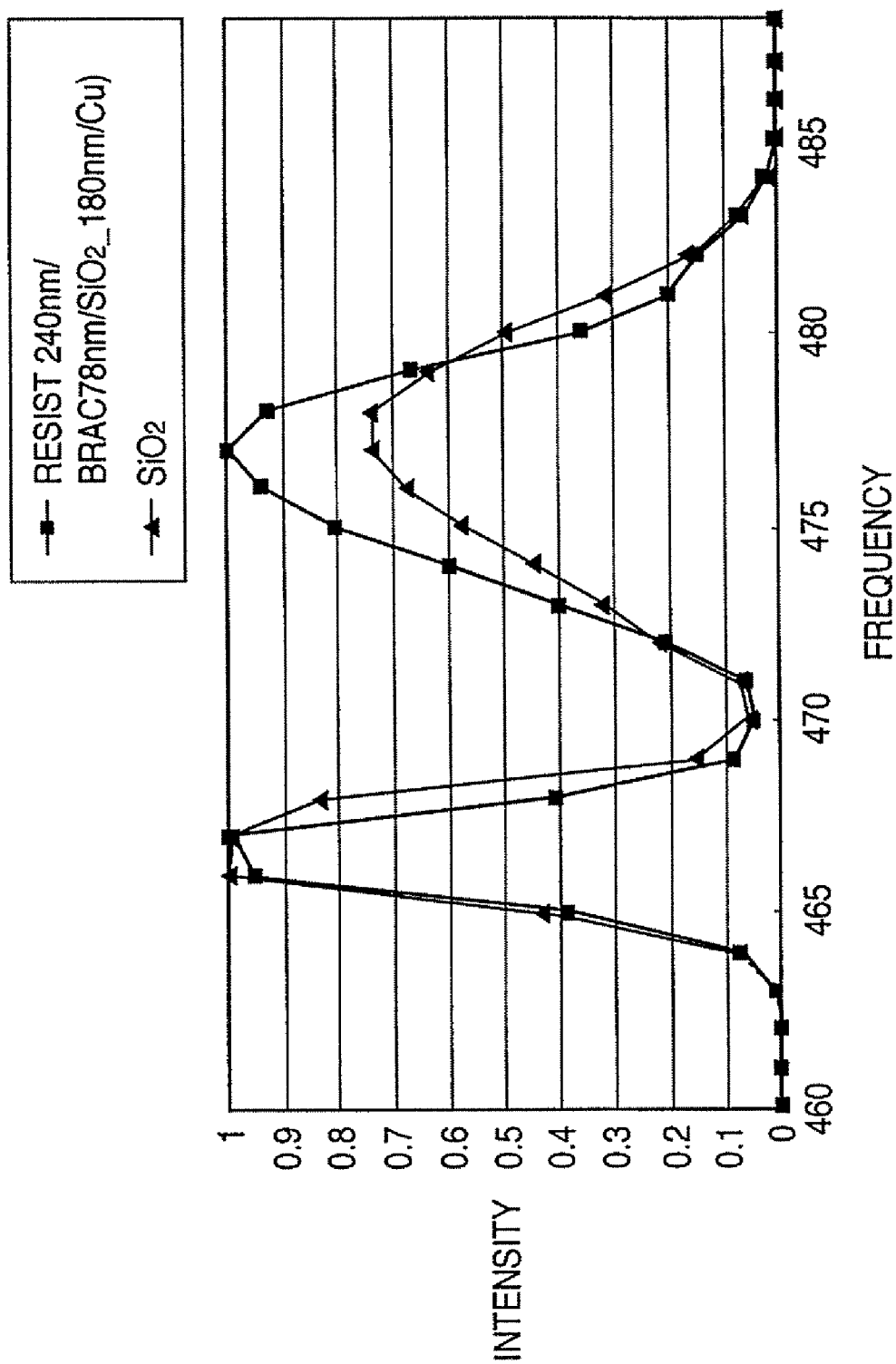
FIG. 42 simultaneously shows the amplitude distributions shown in FIGS. 32 and 41.

In step 3940, an amplitude distribution obtained by Fourier-transforming the interference signal (FIG. 31) from the measurement target in the third embodiment, and that (FIG. 40) obtained by Fourier-transforming the interference signal from the reference plate calculated in step 3930 are normalized. FIG. 32 shows a distribution (to be referred to as a normalized amplitude distribution for the measurement target hereinafter) obtained by normalizing an amplitude distribution obtained by Fourier-transforming an interference signal from the measurement target. FIG. 42 shows a distribution (to be referred to as a normalized amplitude distribution for the reference plate hereinafter) obtained by normalizing an amplitude distribution obtained by Fourier-transforming an interference signal from the reference plate. The frequency range shown in FIG. 42 is the shaping target frequency region (from 460 to 488) as in FIG. 32. FIG. 42 shows a normalized amplitude distribution for the measurement target and that for the reference plate in the shaping target frequency region (from 460 to 488).

Figure 43:
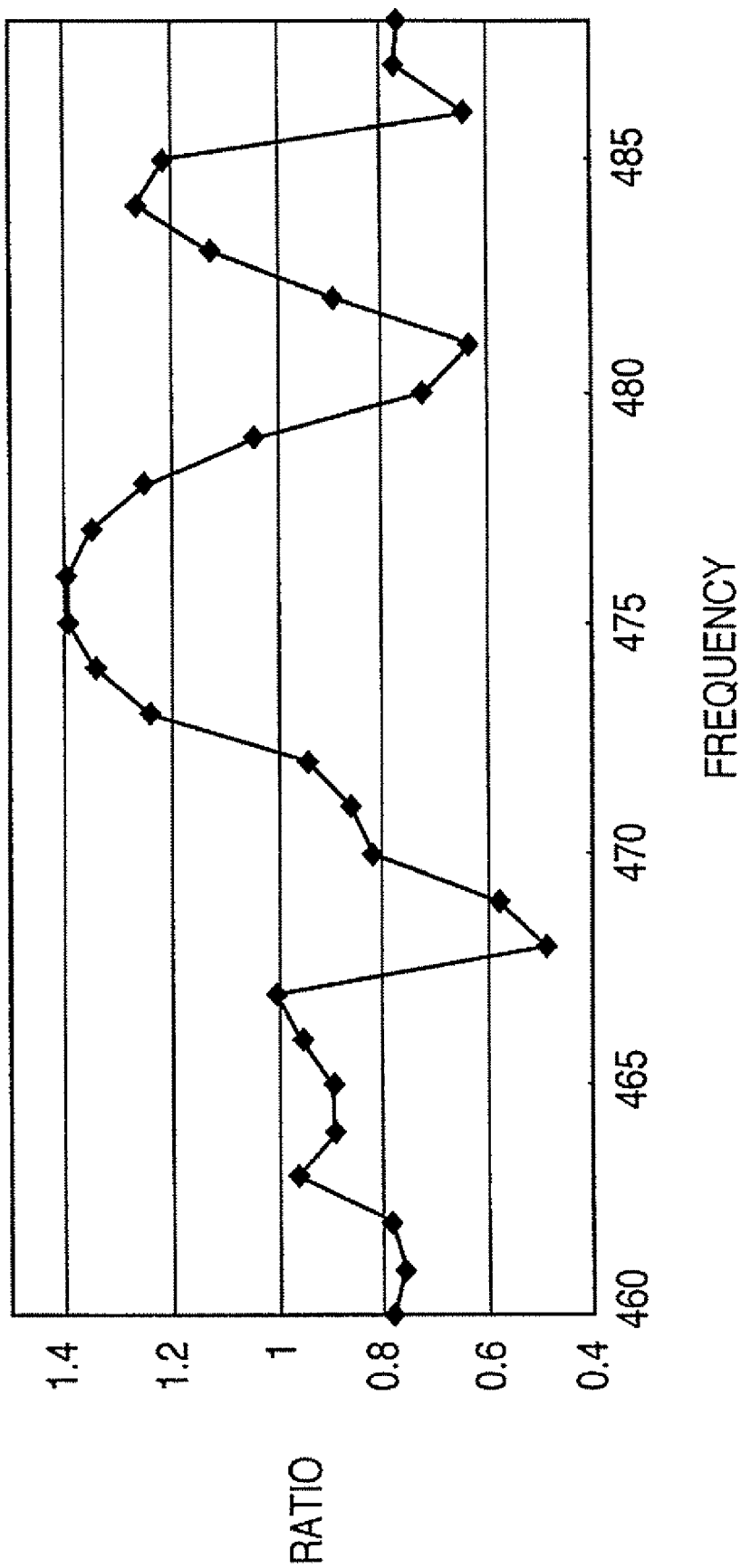
FIG. 43 shows the ratio of the amplitude shown in FIG. 42 to that shown in FIG. 41 at each frequency.

In step 3950, based on the normalized amplitude distribution for the measurement target and that for the reference plate, which are calculated in step 3940, the ratio of the amplitude of the normalized amplitude distribution for the reference plate to that for the measurement target is calculated for each frequency. FIG. 43 shows this result. The ordinate indicates the ratio, and the abscissa indicates the frequency.

Based on the amplitude distribution of a simulation interference signal from the measurement target, and that from the reference plate, an optimal predetermined value used in step 3960 is calculated in advance. The optimal value is, for example, 0 (inclusive) to 1.0 (exclusive) according to an experiment. Also according to the experiment, an optimal value at which the best measurement precision is attained is 0.8.

In the fourth embodiment, the predetermined value is 0.8. Consequently, frequency regions from 460 to 462, from 468 to 469, from 480 to 481, and from 486 to 488 in the shaping target frequency region (from 460 to 488) are determined as abnormal frequency regions.

In step 3970, the same operation as in step 3040 in the third embodiment is executed. Steps 3910 and 3920 are executed only once as long as the wavelength distribution of a light source and the spectral sensitivity of a sensor are constant. After that, the saved amplitude data for the reference plate can be used. These procedures are executed when the light source or sensor is changed.

An interference signal from the measurement target and that from the reference plate may be acquired in the opposite order. Although a case in which an interference signal from the reference plate is Fourier-transformed to calculate and save an amplitude distribution in step 3920 of FIG. 39 has been exemplified, an amplitude distribution for the reference plate, which is normalized in step 3940, may be saved and used.

Fifth Embodiment

Although the third and fourth embodiments have exemplified a case in which an abnormal frequency region determined from the phase distribution is identical to that determined from the amplitude distribution, the abnormal frequency region often differs between them.

In this case, first, an abnormal frequency region (to be referred to as a frequency region P hereinafter) determined from the phase distribution in the third embodiment and an abnormal frequency region (to be referred to as a frequency region A hereinafter) determined from the amplitude distribution in the fourth embodiment are obtained. Next, a frequency region common to the frequency regions P and A is obtained. The amplitude distribution is shaped using this common frequency region as an abnormal frequency region. The shaping can be executed in accordance with step 3040 in the third embodiment.

Alternatively, first, the frequency regions P and A may be obtained. Next, a frequency region including at least one of the frequency regions P and A may be obtained. The amplitude distribution may be shaped using this frequency region as an abnormal frequency region. The shaping can be executed in accordance with step 3040 in the third embodiment.

Sixth Embodiment

In the third, fourth, and fifth embodiments, an abnormal frequency is obtained from an interference signal. In the sixth embodiment, an abnormal frequency region is obtained from the spectral reflection characteristic (e.g., the spectral reflectance distribution) of a substrate surface based on the structure of a measurement target.

First, the spectral reflection phases of S-polarized light and P-polarized light are calculated based on the structure of a measurement target. Next, an abnormal frequency region is obtained based on the spectral reflection phases of the S-polarized light and P-polarized light in accordance with the third embodiment. More specifically, an abnormal frequency region is a frequency region corresponding to a wavelength range in which the amount of phase change of the spectral reflection phase distribution (the slope of the spectral reflection phase distribution) differs from the median value of the slope of the spectral reflection phase distribution by a predetermined amount or more.

Alternatively, the spectral reflectances of S-polarized light and P-polarized light may be calculated on the basis of the structure of a measurement target first. Next, a frequency region corresponding to the neighborhood of a wavelength at which the reflectance takes a local minimum value may be determined as an abnormal frequency region on the basis of the spectral reflectances of the S-polarized light and P-polarized light.

Lastly, an interference signal is Fourier-transformed. The amplitude distribution is shaped whereas the phase distribution is allowed to remain the same.

The shaping can be executed in accordance with step 3040 in the third embodiment.

Seventh Embodiment

Figure 26:
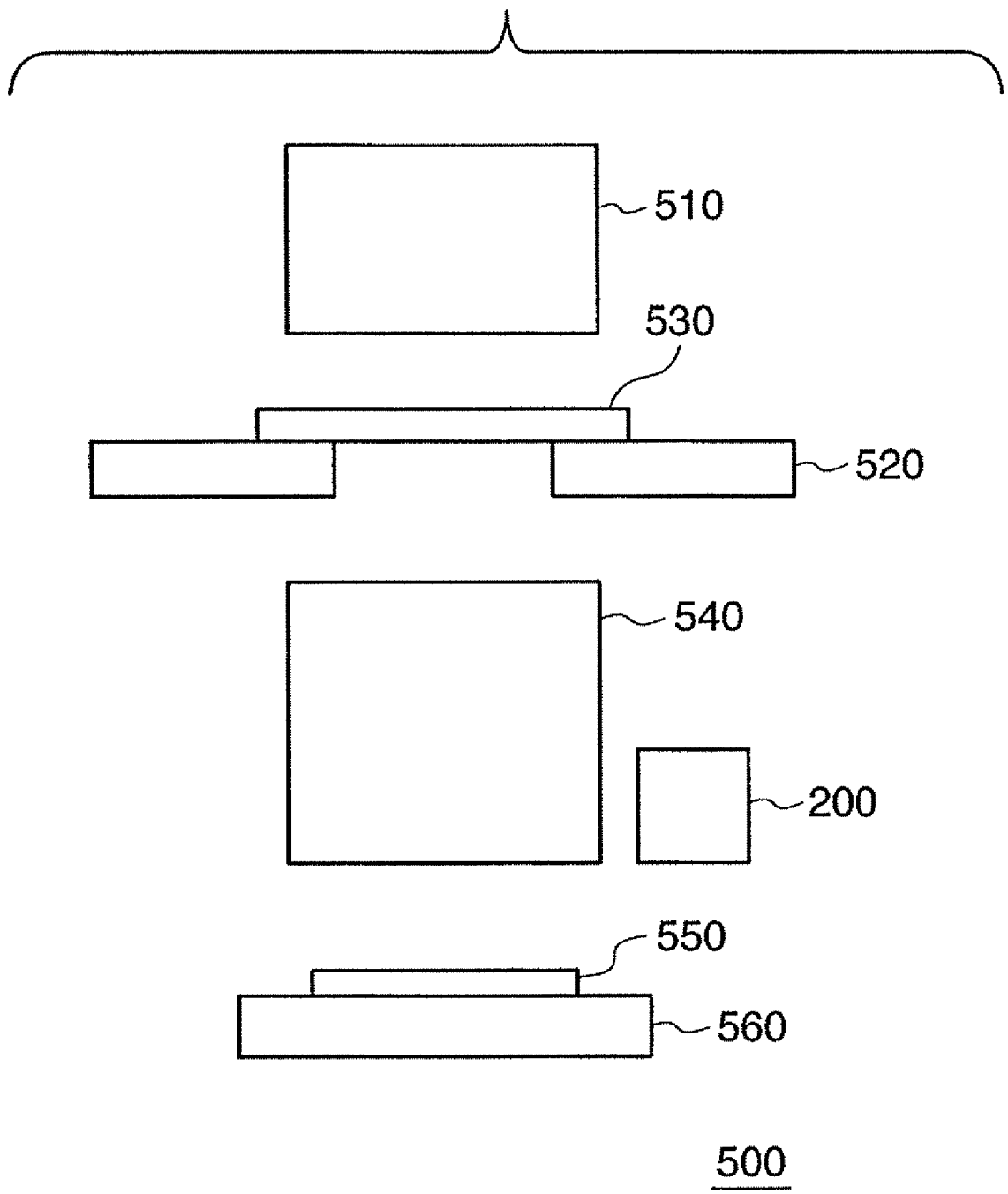
FIG. 26 shows the schematic arrangement of an exposure apparatus according to an application example of the present invention.

FIG. 26 shows the schematic arrangement of an exposure apparatus according to the seventh embodiment of the present invention. An exposure apparatus 500 according to the seventh embodiment of the present invention is configured to form a latent image pattern on a resist applied on a substrate 550. The exposure apparatus 500 comprises a substrate stage 560 which holds the substrate 550, an original stage 520 which holds an original 530, and a projection optical system 540 which projects the pattern of the original 530 onto the substrate 550. The exposure apparatus 500 also comprises the above-described shape measuring apparatus 200 configured to measure the surface shape (typically, the resist surface shape) of the substrate 550.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2007-041277, filed Feb. 21, 2007, and 2007-140863 filed May 28, 2007, which are hereby incorporated by reference herein in their entirety.

What is claimed is:

1. An information processing apparatus that processes an interference signal obtained by sensing interference light formed by reference light and measurement light, the apparatus comprising:
    a unit configured to calculate an amplitude distribution that indicates a relationship between an amplitude of the interference light and a wavelength, based on the interference signal;
    a unit configured to change the amplitude distribution; and
    a unit configured to calculate a signal corresponding to interference light having the changed amplitude distribution.

2. The apparatus according to claim 1, wherein the amplitude distribution is calculated by Fourier-transforming the interference signal.

3. The apparatus according to claim 1, wherein the signal corresponding to the interference light having the changed amplitude distribution is a signal obtained by inversely Fourier-transforming the changed amplitude distribution and a phase distribution, the phase distribution being obtained by Fourier-transforming the interference signal.

4. The apparatus according to claim 1, wherein the amplitude distribution is changed such that an amplitude distribution having a flat portion is obtained as the changed amplitude distribution.

5. The apparatus according to claim 4, wherein the amplitude distribution is changed such that an amplitude distribution, having a flat portion in a frequency region in which a phase distribution obtained by Fourier-transforming the interference signal has a linearity higher than a reference value, is obtained as the changed amplitude distribution.

6. A computer readable storage medium storing a program that causes a computer to process an interference signal obtained by sensing interference light formed by reference light and measurement light, the program comprising:
    a step of calculating an amplitude distribution that indicates a relationship between an amplitude of the interference light and a wavelength, based on the interference signal;
    a step of changing the amplitude distribution; and
    a step of calculating a signal corresponding to interference light having the changed amplitude distribution.

7. A measurement apparatus that senses interference light formed by reference light and measurement light and calculates a structure of a measurement target based on the sensed interference light, the apparatus comprising:
    a unit configured to calculate an amplitude distribution that indicates a relationship between an amplitude of the interference light and a wavelength, based on an interference signal obtained by sensing the interference light formed by reference light and the measurement light;
    a unit configured to change the amplitude distribution;
    a unit configured to calculate a signal corresponding to interference light having the changed amplitude distribution; and
    a unit configured to calculate the structure of the measurement target based on the signal corresponding to the interference light having the changed amplitude distribution.

8. A computer readable storage medium storing a program that causes a computer to calculate a structure of a measurement target based on an interference signal obtained by sensing interference light formed by reference light and measurement light, the program comprising:
    a step of calculating an amplitude distribution that indicates a relationship between an amplitude of the interference light and a wavelength, based on the interference signal;
    a step of changing the amplitude distribution; and
    a step of calculating a signal corresponding to interference light having the changed amplitude distribution;
    a step of calculating the structure of the measurement target based on the signal corresponding to the interference light having the changed amplitude distribution.

9. The computer readable storage medium according to claim 8, wherein the amplitude distribution is calculated by Fourier-transforming the interference signal.

10. The computer readable storage medium according to claim 8, wherein the signal corresponding to the interference light having the changed amplitude distribution is a signal obtained by inversely Fourier-transforming the changed amplitude distribution and a phase distribution, the phase distribution being obtained by Fourier-transforming the interference signal.

11. The computer readable storage medium according to claim 8, wherein the amplitude distribution is changed such that an amplitude distribution having a flat portion is obtained as the changed amplitude distribution.

12. The computer readable storage medium according to claim 11, wherein the amplitude distribution is changed such that an amplitude distribution, having a flat portion in a frequency region in which a phase distribution obtained by Fourier-transforming the interference signal has a linearity higher than a reference value, is obtained as the changed amplitude distribution.

* * * * *